US010701826B2

(12) United States Patent
Ryu et al.

(10) Patent No.: US 10,701,826 B2
(45) Date of Patent: Jun. 30, 2020

(54) DISPLAY DEVICE

(71) Applicant: LG ELECTRONICS INC., Seoul (KR)

(72) Inventors: Jaeuk Ryu, Seoul (KR); Woohyuk Choi, Seoul (KR); Jaekun Kim, Seoul (KR); Junhyung Kim, Seoul (KR); Manin Baek, Seoul (KR); Bosung Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/799,268

(22) Filed: Oct. 31, 2017

(65) Prior Publication Data

US 2019/0069425 A1    Feb. 28, 2019

(30) Foreign Application Priority Data

Aug. 28, 2017  (WO) ................ PCT/KR2017/009380

(51) Int. Cl.
*H05K 5/03*   (2006.01)
*H05K 7/20*   (2006.01)
(Continued)

(52) U.S. Cl.
CPC ......... *H05K 5/03* (2013.01); *G02F 1/133308* (2013.01); *H01L 51/5237* (2013.01);
(Continued)

(58) Field of Classification Search
CPC ......... G02F 1/133308; G02F 1/133314; G02F 1/1601; G02F 1/203; G02F 1/1613;
(Continued)

(56) References Cited

U.S. PATENT DOCUMENTS

| 5,912,944 A * | 6/1999 | Budinski ................ G03B 42/04 378/182 |
| 2009/0067112 A1* | 3/2009 | Takabayashi ....... G02F 1/13452 361/220 |

(Continued)

FOREIGN PATENT DOCUMENTS

| KR | 10-2011-0062786 A | 6/2011 |
| KR | 10-2015-0066021 A | 6/2015 |
| KR | 10-2016-0070941 A | 6/2016 |

*Primary Examiner* — Daniel P Wicklund
*Assistant Examiner* — Amir A Jalali
(74) *Attorney, Agent, or Firm* — Birch, Stewart, Kolasch & Birch, LLP

(57) ABSTRACT

A display device including a display panel; and a module cover positioned at a rear of the display panel. The module cover includes a flat plate portion corresponding to a rear surface of the display panel; a side wall extended toward a front of the display panel from the flat plate portion, the side wall covering an edge of the display panel; and a bent portion between the flat plate portion and the side wall; Further, the flat plate portion includes a flat plate portion first layer at the rear of the display panel; a flat plate portion second layer at a rear of the flat plate portion first layer; and a flat plate portion third layer at a rear of the flat plate portion second layer. In addition, the flat plate portion second layer includes a material having a greater rigidity than a material of the flat plate portion first layer or the flat plate portion third layer.

19 Claims, 23 Drawing Sheets

(51) Int. Cl.
 *H05K 5/00* (2006.01)
 *H01L 51/52* (2006.01)
 *H01L 51/56* (2006.01)
 *G02F 1/1333* (2006.01)

(52) U.S. Cl.
 CPC .......... *H01L 51/56* (2013.01); *H05K 5/0017* (2013.01); *H05K 7/20954* (2013.01); *G02F 2001/133314* (2013.01); *H01L 51/529* (2013.01); *H05K 7/20127* (2013.01)

(58) Field of Classification Search
 CPC ....... G02F 1/1626; G02F 1/1637; H05K 5/03; H05K 5/0017; H05K 5/0217; H05K 7/20454; H05K 7/20509; H05K 7/20954; H05K 7/20127; H01L 51/5237; H01L 51/529; H01L 51/56
 USPC ...... 361/690, 704, 707, 711, 679.24, 679.54, 361/679.61; 349/58; 174/556
 See application file for complete search history.

(56) References Cited

U.S. PATENT DOCUMENTS

| | | | | |
|---|---|---|---|---|
| 2009/0168318 A1* | 7/2009 | Moon | ................. | H01L 51/5237 361/679.21 |
| 2009/0316090 A1* | 12/2009 | Fujikawa | .......... | G02F 1/133512 349/110 |
| 2010/0188596 A1* | 7/2010 | Juan | ................. | G02F 1/133308 349/58 |
| 2010/0188607 A1* | 7/2010 | Park | ..................... | G02B 6/0073 349/62 |
| 2011/0292315 A1* | 12/2011 | Bae | ...................... | G02B 6/0088 349/58 |
| 2013/0170116 A1* | 7/2013 | In | .............................. | H05K 7/00 361/679.01 |
| 2013/0256671 A1* | 10/2013 | Chen | ..................... | H01L 27/153 257/59 |
| 2014/0092631 A1 | 4/2014 | Fujii et al. | | |
| 2014/0285747 A1* | 9/2014 | Jun | .................... | G02F 1/133308 349/58 |
| 2014/0340875 A1* | 11/2014 | Hayashi | ............ | G02F 1/133308 362/97.1 |
| 2015/0085471 A1* | 3/2015 | Jeon | .................. | G02F 1/133608 362/97.2 |
| 2015/0146361 A1* | 5/2015 | Kawanishi | ............ | G06F 1/1637 361/679.26 |
| 2015/0245513 A1* | 8/2015 | Moon | ....................... | G06F 1/20 361/679.01 |
| 2015/0253616 A1* | 9/2015 | Na | .................... | G02F 1/133308 349/58 |
| 2015/0277029 A1* | 10/2015 | Watanabe | ......... | G02F 1/133308 362/606 |
| 2015/0277131 A1* | 10/2015 | Park | .................... | G02B 27/2221 349/58 |
| 2016/0054613 A1* | 2/2016 | Lee | .................... | G02F 1/133308 362/97.2 |
| 2016/0096925 A1* | 4/2016 | Sun | ........................ | C08G 69/32 428/220 |
| 2017/0118859 A1* | 4/2017 | Kang | ................... | H05K 5/0017 |
| 2017/0171989 A1* | 6/2017 | Kim | ........................ | G06F 3/041 |
| 2017/0345874 A1* | 11/2017 | Kim | ........................ | B22C 7/026 |
| 2018/0011576 A1* | 1/2018 | Ryu | ........................ | G06F 1/1652 |
| 2018/0033571 A1* | 2/2018 | Choi | ..................... | G06F 3/0202 |
| 2018/0039136 A1* | 2/2018 | Shim | .................... | G02B 6/0025 |
| 2018/0157090 A1* | 6/2018 | Kim | ................. | G02F 1/133308 |

\* cited by examiner (a)

(b)

DISPLAY DEVICE

This application claims the benefit of PCT Application No. PCT/KR2017/009380 filed on Aug. 28, 2017, the entire contents of which are incorporated herein by reference for all purposes as if fully set forth herein.

BACKGROUND OF THE INVENTION

Field of the Invention

The present invention relates to a display device, and more particularly to a display device having a module cover coupled to the display panel to provide the display panel with rigidity.

Discussion of the Related Art

As the information society develops, the demand for display devices has been increased in various forms. The display can be implemented by using an LCD (Liquid Crystal Display Device), a PDP (Plasma Display Panel), an ELD (Electroluminescent Display), a VFD (Vacuum Fluorescent Display), and an OLED (Organic Light Emitting Diode).

Recently, research has been conducted on a display device having a structure attached to the rear surface of a display panel to provide rigidity to the display panel.

SUMMARY OF THE INVENTION

Accordingly, one object of the present disclosure is to address the problems with the related art.

Another object of the present invention is to reduce the thickness of the display device.

Another object of the present invention is to provide a slimmer bezel of the display device.

Still another object of the present invention is to reduce the weight of the display device.

Yet another object of the present invention is to provide a display device having a structure for stably protecting a display panel.

Another object of the present invention is to improve the rigidity of the display device.

Still another object of the present invention is to simplify the manufacturing process of the display device.

Another object of the present invention is to reduce the manufacturing cost of the display device.

To achieve these and other advantages and in accordance with the purpose of the present invention, as embodied and broadly described herein, the present invention provides in one aspect a display device including a display panel; and a module cover positioned at a rear of the display panel. The module cover includes a flat plate portion corresponding to a rear surface of the display panel; a side wall extended toward a front of the display panel from the flat plate portion, the side wall covering an edge of the display panel; and a bent portion between the flat plate portion and the side wall; Further, the flat plate portion includes a flat plate portion first layer at the rear of the display panel; a flat plate portion second layer at a rear of the flat plate portion first layer; and a flat plate portion third layer at a rear of the flat plate portion second layer. In addition, the flat plate portion second layer includes a material having a greater rigidity than a material of the flat plate portion first layer or the flat plate portion third layer.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
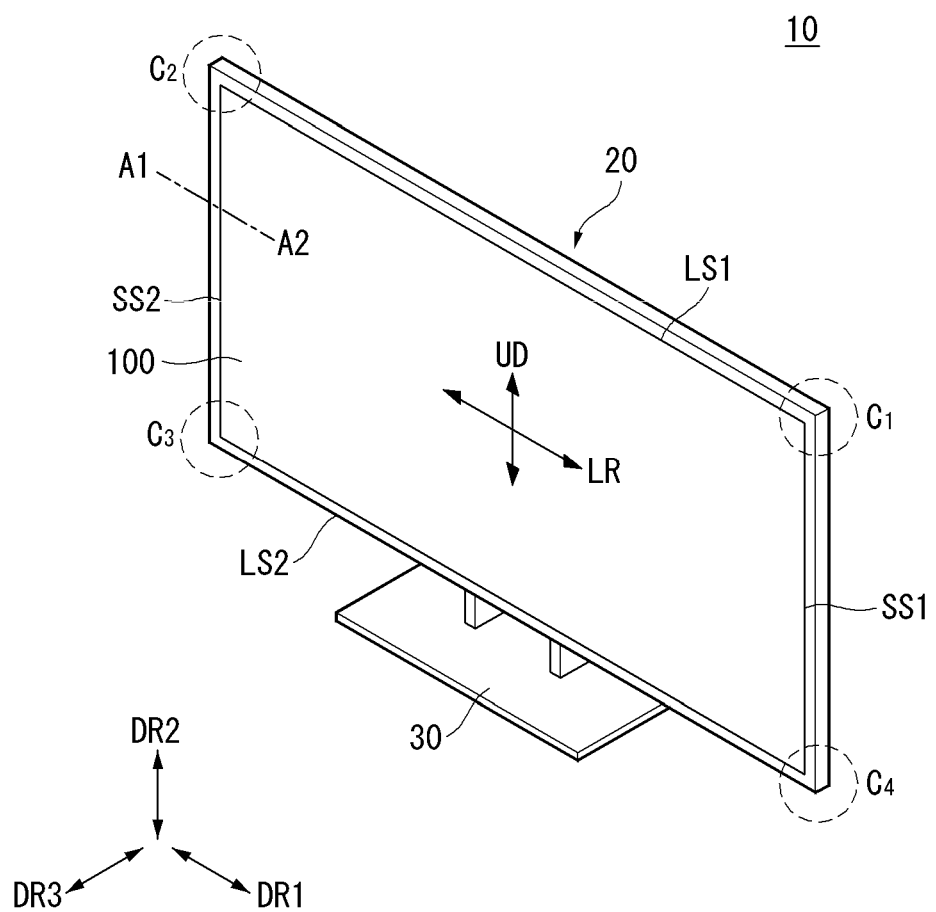
FIGS. 1 to 5 are views showing a display device according to various embodiments of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component. The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

The display panel applicable to the present invention may be an organic light emitting diode panel (OLED panel), a plasma display panel (PDP), a field emission display panel (FED panel), and a liquid crystal panel (LCD panel). Referring to FIG. 1, the display device 10 includes a display unit 20 and a pedestal 30. The display unit 20 may have a planar shape as a whole, and the pedestal 30 can extend downward from the display unit 20 and support the display unit 20.

Further, the display unit 20 includes a first long side LS1 and a second long side LS2 opposite to the first long side LS1. The display unit 20 also includes a first short side SS1 and a second short side SS2 opposite to the first short side SS1. As shown, the first short side SS1 is adjacent to both the first long side LS1 and the second long side LS2.

An area adjacent to the first short side SS1 can be referred to as a first short side area SS1, and an area adjacent to the second short side SS2 can be referred to as a second short side area SS2. Further, an area adjacent to the first long side LS1 can be referred to as a first long side area LS1, and area adjacent to the second long side LS2 can be referred to as a second long side area LS2.

In addition, the first short side area SS1 can be referred to as a first side area, and the second short side area SS2 can be referred to as a second side area. Also, the first long side area LS1 can be referred to as a third side area, and the second long side area LS2 can be referred to as a fourth side area.

The lengths of the first and second long sides LS1 and LS2 may be longer than the lengths of the first and second short sides SS1 and SS2 for the convenience of explanation. It is also possible that the lengths of the first and second long sides LS1 and LS2 are substantially equal to the lengths of the first and second short sides SS1 and SS2.

The display unit 20 also includes a display panel 100 for displaying an image. In particular, the display panel 100 forms a front surface of the display unit 20 and displays an image toward the front of the display unit 20.

Further, the first direction DR1 may be a direction along to the long sides LS1 and LS2 of the display unit 20, and the second direction DR2 may be a direction along to the short sides SS1 and SS2 of the display unit 20. The third direction DR3 may be a direction normal to the first direction DR1 and/or the second direction DR2. Also, the first direction DR1 can be referred to as a horizontal direction, and the first direction DR1 may be a virtual horizontal axis. In addition, the second direction DR2 can be referred to as a vertical direction and may be a virtual vertical axis. The third direction DR3 may be a back-and-forth direction and may be another virtual horizontal axis.

A side on which the display unit 20 displays the image can be referred to as a 'forward direction' or a 'front side' of the display unit 20. Also, a side on which the image cannot be viewed can be referred to as a 'rearward direction' or a 'rear side' of the display unit 20. From the viewpoint of the front side of the display unit 20, the first long side LS1 can be referred to as an upper side or an upper surface, the second long side LS2 side can be referred to as a lower side or a lower surface, the first short side SS1 can be referred to as a right side or the right side, and the second short side SS2 can be referred to as a left side or a left side.

In addition, the first long side LS1, the second long side LS2, the first short side SS1 and the second short side SS2 can be referred to as an edge of the display unit 20. Also, the area where the first long side LS1, the second long side LS2, the first short side SS1, and the second short side SS2 meet with each other can be referred to as a corner. For example, the area where the first long side LS1 and the first short side SS1 meet can be referred to as a first corner C1. The area where the first long side LS1 and the second short side SS2 meet can be referred to as a second corner C2. The area where the second short side SS2 and the second long side LS2 meet can be referred to as a third corner C3. The area where the second long side LS2 and the first short side SS1 meet can be referred to as a fourth corner C4.

In addition, the direction from the first short side SS1 to the second short side SS2 or the direction from the second short side SS2 to the first short side SS1 can be referred to as the left and right direction LR. The direction from the first long side LS1 to the second long side LS2 or the direction from the second long side LS2 to the first long side LS1 can be referred to as the up and down direction UD.

Figure 2:
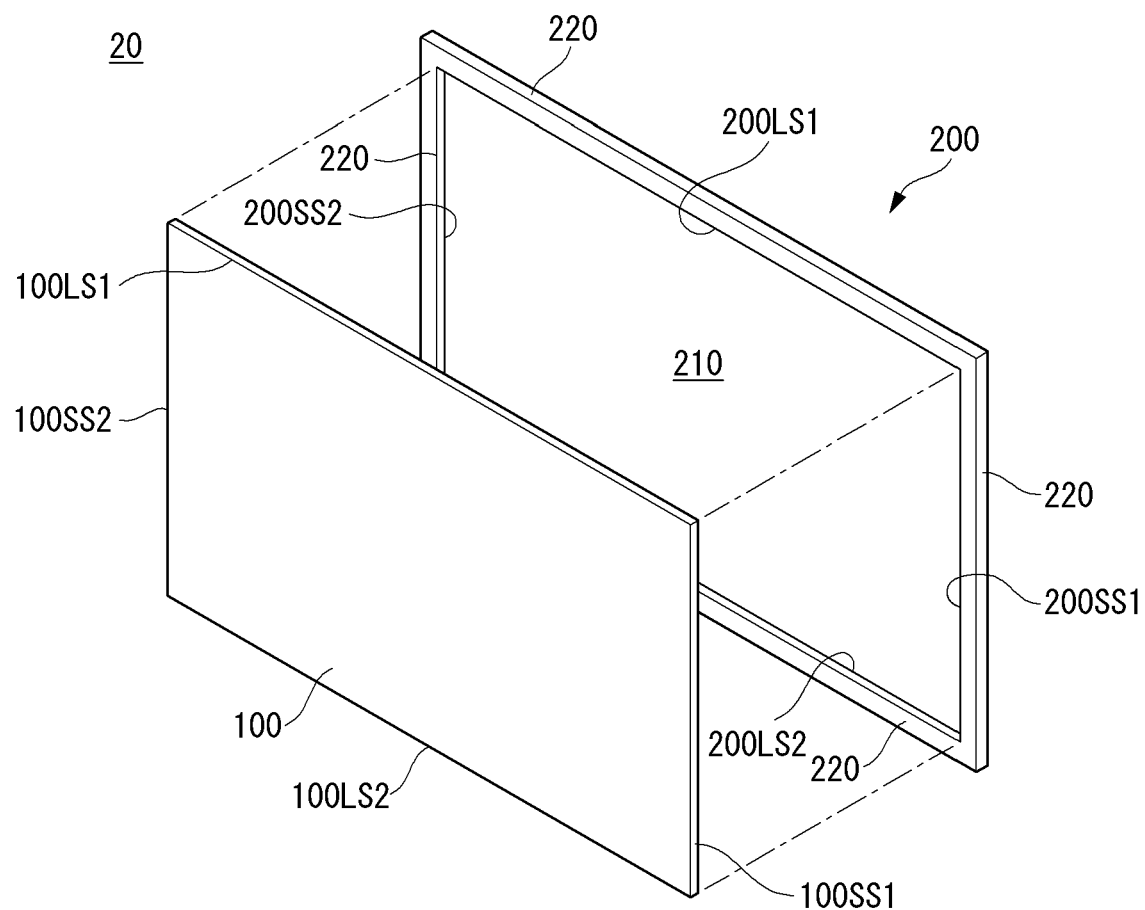

Referring to FIG. 2, the module cover 200 includes a flat plate portion 210 and a side wall 220. The module cover 200 is disposed behind the display panel 100 and can be attached to the display panel 100. Further, the flat plate portion 210 can be referred to as a bottom portion 210.

The module cover 200 includes a first short side 200SS1, a first long side 200LS1, a second short side 200SS2, and a second long side 200LS2. In particular, the first short side 200SS1, the first long side 200LS1, the second short side 200SS2 and the second long side 200LS2 of the module cover 200 form a circumference of the module cover 200.

Also, the first short side 200SS1, the first long side 200LS1, the second short side 200SS2 and the second long side 200LS2 of the module cover 200 correspond to the first short side SS1, the first long side LS1, the second short side SS2, and the second long side LS2 of the display unit 20 (see FIG. 1), respectively.

The display panel 100 also forms a first short side 100SS1, a first long side 100LS1, a second short side 100SS2 and a second long side 100LS2. The first short side 100SS1, the first long side 100LS1, the second short side 100SS2 and the second long side 100LS2 of the display panel 100 form an outer circumference of the display panel 100.

In addition, the first short side 100SS1 of the display panel 100 can be referred to as a first side 100SS1 of the display panel 100, and the second short side 100SS2 of the display panel 100 can be referred to as the second side 100SS2 of the display panel 100. Also, the first long side 100LS1 of the display panel 100 can be the third side 100LS1 of the display panel 100, and the second long side 100LS2 of the display panel 100 can be regarded as the fourth side 100LS2 of the display panel 100.

Further, the first short side 100SS1, the first long side 100LS1, the second short side 100SS2 and the second long side 100LS2 of the display panel 100 respectively correspond to the first short side 200SS1, the first long side 200LS1, the second short side 200SS2, and the second long side 200LS2 of the module cover 200.

The length of the first short side 100SS1 of the display panel 100 may not be greater than the length of the first short side 200SS1 of the module cover 200. Also, the length of the second short side 100SS2 of the display panel 100 may not be greater than the length of the second short side 200SS2 of the module cover 200. Further, the length of the first long side 100LS1 of the display panel 100 may not be greater than the length of the first long side 200LS1 of the module cover 200, and the length of the second long side 100LS2 of the display panel 100 may not be greater than the length of the second long side 200LS2 of the module cover 200.

In addition, the module cover 200 can support the display panel 100. The module cover 200 may have rigidity and include a metal. For example, the module cover 200 may include aluminum. Also, the flat plate portion 210 of the module cover 200 may have a shape of a thin plate and face the rear surface of the display panel 100. The flat plate portion 210 can also be coupled to the display panel 100 and support the display panel 100.

Further, the side wall 220 of the module cover 200 can be disposed at the edges 200SS1, 200SS2, 200LS1, and 200LS2 of the module cover 200. The side wall 220 of the module cover 200 may be provided in plurality. The plurality of side walls 220 of the module cover 200 can face the edges 100SS1, 100SS2, 100LS1, and 100LS2 of the display panel 100.

In addition, the side wall 220 and the flat plate portion 210 of the module cover 200 can form a space opened toward the front of the module cover 200. In particular, the side wall 220 and the flat plate portion 210 of the module cover 200 can form a space capable of accommodating the display panel 100. The side wall 220 of the module cover 200 can also have a shape that wraps or covers the display panel 100.

Further, the display panel 100 is positioned in front of the flat plate portion 210 and is flexible. Thus, the display panel 100 is provided with rigidity from the module cover 200 and is housed in the module cover 200. As discussed above, the display panel 100 displays an image.

Figure 3:
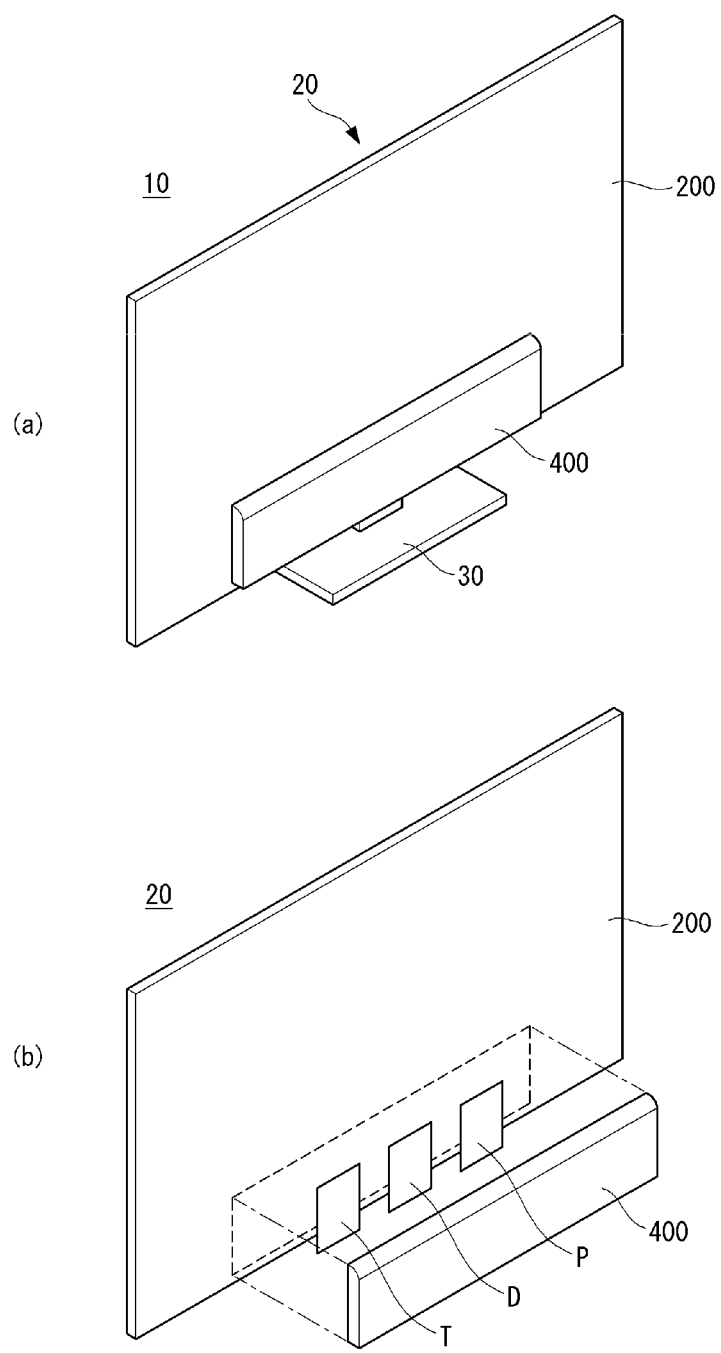

Referring to FIG. 3 (a), the display unit 20 includes a back cover 400 forming a portion of the rear surface of the display unit 20. In particular, the back cover 400 is located behind the module cover 200. For example, the back cover 400 can be disposed at a lower portion of the rear surface of the module cover 200. The back cover 400 may include a synthetic resin and can be referred to as a PCB cover 400.

Referring to FIG. 3 (b), the display unit 20 includes a power supply board P, a driving board D, and a tuner board T. The power supply board P, the driving board D and the tuner board T may be located at the lower portion of the display unit 20 and can be covered by the back cover 400.

Further, the power supply board P can be connected to an external power source and can rectify the AC power to the DC power. The power supply board P can also provide the display unit 20 or the display panel 100 with electric power. For example, the power supply board P can provide DC power to the display unit 20 or the display panel 100.

In addition, the driving board D can control the display of the image of the display unit 20, and the tuner board T can receive broadcast information or external input information. The tuner board T can provide the driving board D with the received broadcast information or external input information.

Figure 4:
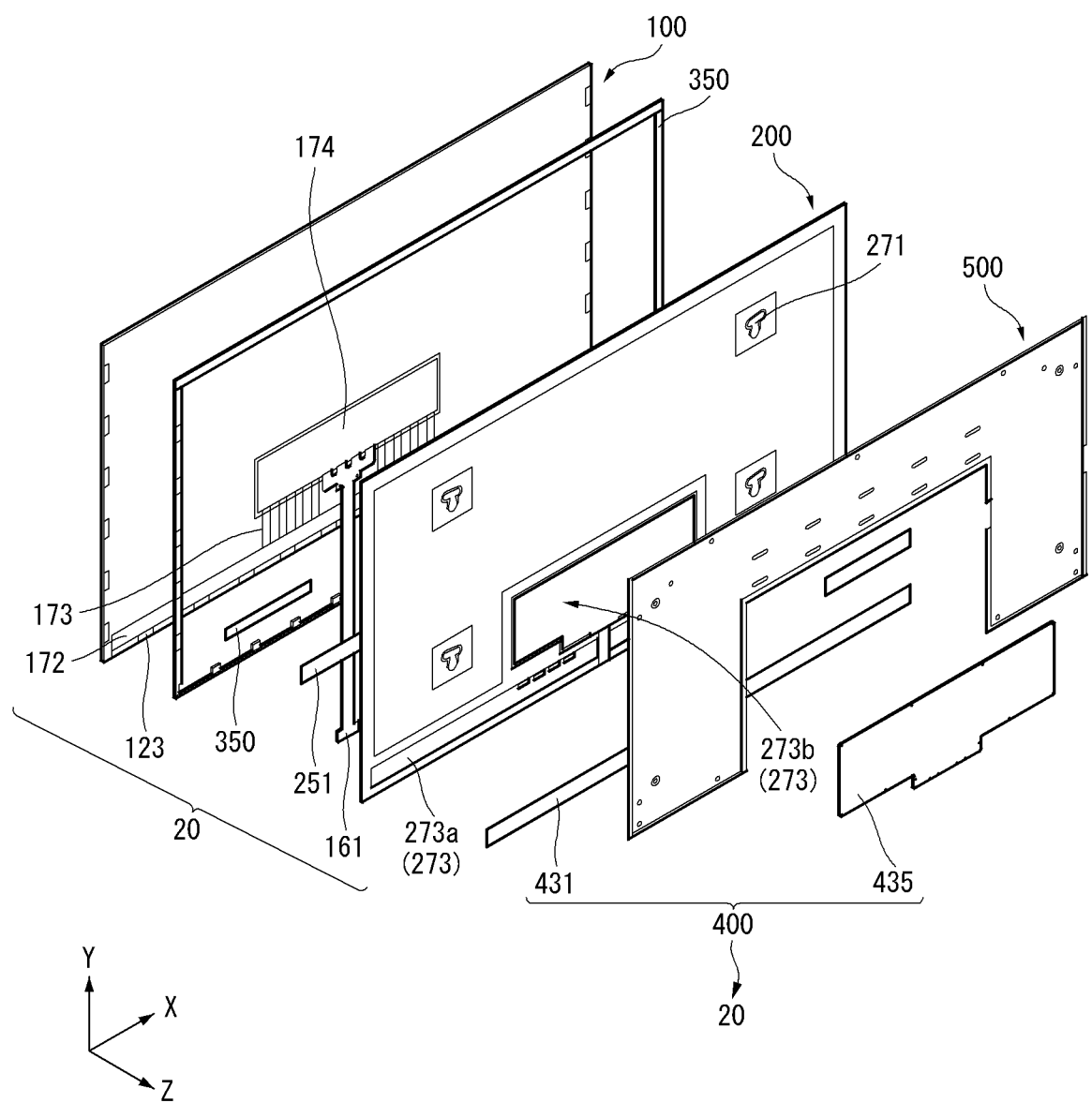

Referring to FIG. 4, the display device 10 includes a display unit 20 and a wall bracket 500. As shown, the display unit 20 includes a display panel 100, a module cover 200, and a PCB cover 400.

Further, the display panel 100 is positioned at the front side of the display unit 20 and displays an image. In more detail, the display panel 100 includes a plurality of pixels for displaying an image by outputting RGB (red, green or blue). The display panel 100 includes an active area in which an image is displayed and an in-active area in which no image is displayed.

In addition, the display panel 100 may include an organic light emitting diode (OLED). Thus, the display panel 100 can emit light by itself and can have a very small thickness.

At least one source PCB 172 and an interface PCB 174 can be disposed on the back side of the display panel 100. In more detail, the interface PCB 174 can be spaced apart from the at least one source PCB 172. Also, at least one source PCB 172 can be adjacent to the edge of the display panel 100 relative to the interface PCB 174. Further, at least one source PCB 172 may be provided in plurality. The plurality of source PCBs 172 can be disposed apart from each other.

At least one PCB connector 173 can be disposed on the rear side of the display panel 100 and can electrically connect the interface PCB 174 and the source PCB 172. In addition, the interface PCB 174 can mount wires for carrying digital video data and timing control signals transmitted from the outside of the display unit 20.

The source PCB 172 can electrically connect the interface PCB 174 and the display panel 100. Further, the source COF (Chip On Film) 123 can connect the source PCB 172 and the display panel 100. The source COF 123 may extend from the edge of the display panel 100 to the source PCB 172. The source COF 123 may mount a data integrated circuit. The source COF 123 and the source PCB 172 may be integrally formed.

The adhesive sheet 350 is positioned on the rear surface of the display panel 100 and couples the display panel 100 and the module cover 200. The adhesive sheet 350 may be in the form of a rectangular photo-frame having a hollow portion and be positioned along the edges of the display panel 100.

Further, the insulating sheet 251 can be positioned between the display panel 100 and the module cover 200 and be attached to the module cover 200. The insulating sheet 251 can protect the source PCB 172 from electromagnetic noise and includes an insulating material.

The module cover 200 is provided on the rear surface of the display panel 100 and can be attached to the display panel 100 by the adhesive sheet 350. Further, the module cover 200 supports the rear surface of the display panel 100 and provides rigidity to the display panel 100. The module cover 200 preferably includes a lightweight and highly rigid material. For example, the module cover 200 can include aluminum.

In addition, the tilting hole 271 can be formed in the module cover 200 and can receive a hook formed on the wall bracket 500. The hook formed on the wall bracket 500 may have a shape of a protrusion. Further, the wall bracket 500 may be installed at a structure such as a wall. Thus, the display unit 20 can be supported on the wall bracket 500. For example, when the tilting hole 271 receives the hook formed in the wall bracket 500, the display unit 20 can hang on the wall bracket 500.

The opening 273 is formed in the module cover 200 and includes a first opening 273a and a second opening 273b. The first opening 273a may correspond to the source PCB 172. For example, the first opening 273a may be adjacent to an edge of the module cover 200 and can receive the source PCB 172.

In addition, the second opening 273b may correspond to the interface PCB 174. For example, the second opening 273b can be located at the central portion of the module cover 200 and receive the interface PCB 174.

Further, the PCB cover 400 may be located behind the interface PCB 174 or behind the source PCB 172. In more detail, the PCB cover 400 includes a first PCB cover 431 and a second PCB cover 435. The first PCB cover 431 may be located behind the source PCB 172 and the second PCB cover 435 may be located behind the interface PCB 174. The first PCB cover 431 also covers the source PCB 172 and the second PCB cover 435 covers the interface PCB 174. The PCB cover 400 includes an insulating material and can protect the source PCB 172 and the interface PCB 174 from leakage electric currents.

Figure 5:
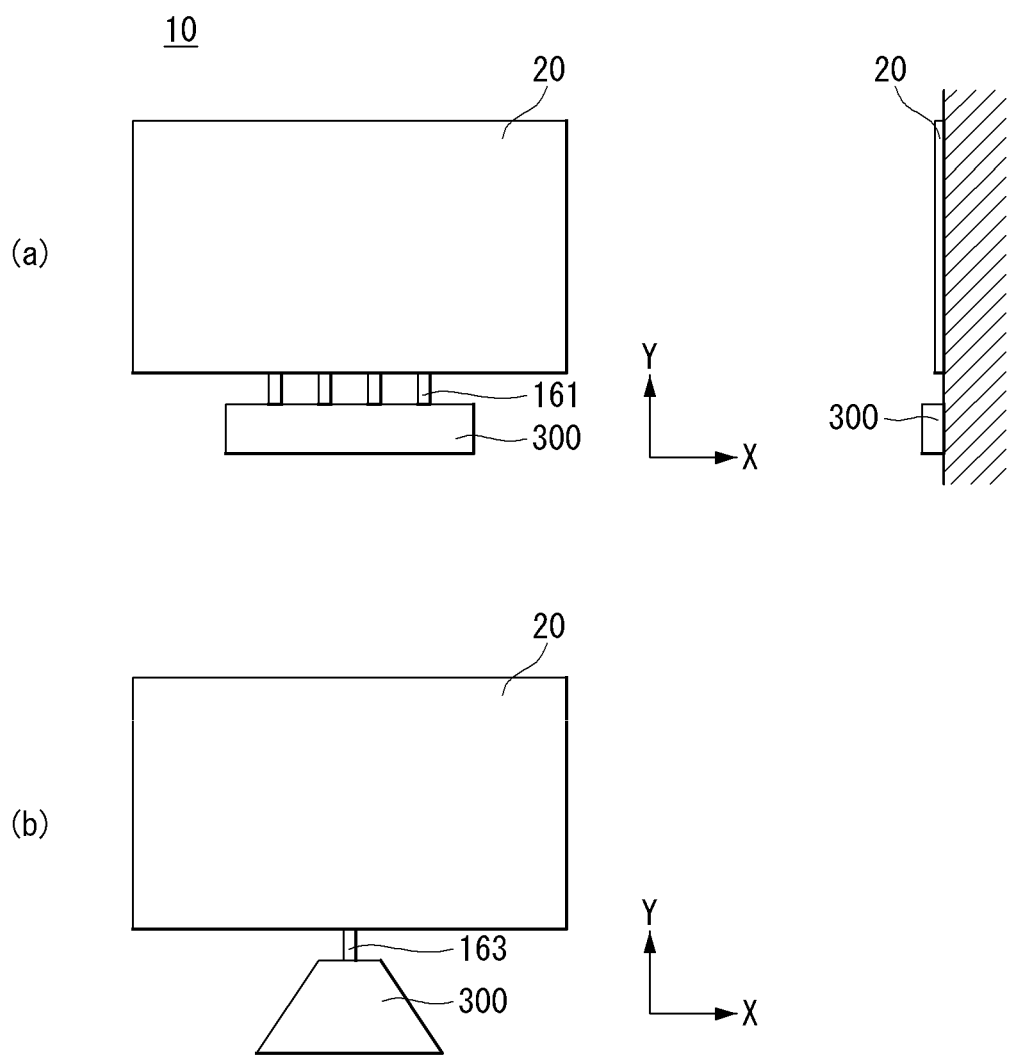

Referring to FIG. 5, the display device 10 includes a display unit 20 and a control unit 300 electrically connected to the display unit 20. In more detail, the control unit 300 provides signals and/or power to the display unit 20 and includes components that drive the display device 10. The case of the control unit can also shield the components. For example, the case of the control unit 300 can shield at least one printed circuit board (PCB).

Referring to FIG. 5 (a), the display device 10 includes a cable 161 such as a flat cable 161. The flat cable 161 can electrically connect the display unit 20 and the control unit 300. A plurality of flat cables 161 can also be provided. Referring to FIG. 5 (b), the display device 10 includes a cable 163 such as a circular cable 163. The circular cable 163 may be thicker than the flat cable 161.

Figure 6:
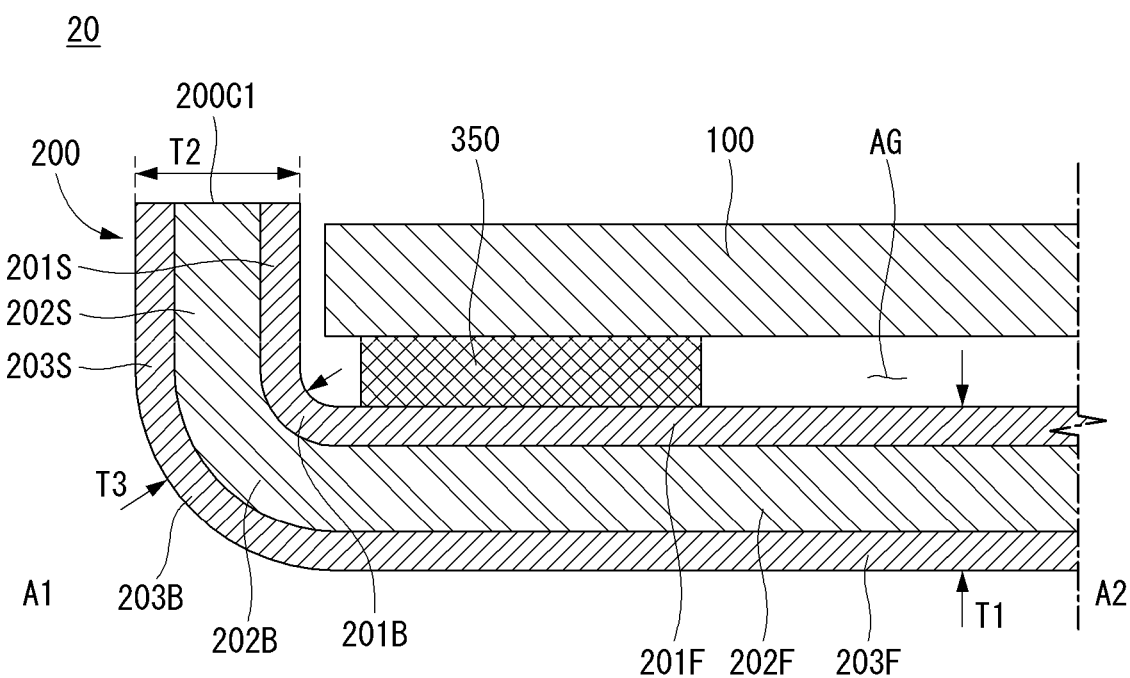
FIGS. 6 to 13 are views showing, in accordance with various embodiments of the present invention, a cross-section of the display unit of FIG. 1 taken along the line A1-A2.

Referring to FIG. 6, the module cover 200 can be positioned behind the display panel 100 and face the rear surface of the display panel 100. Further, the adhesive sheet 350 can be positioned between the display panel 100 and the module cover 200 and couple the display panel 100 with the module cover 200. The adhesive sheet 350 can also be referred to as an adhesive tape 350. The adhesive sheet 350 may be, for example, a double-sided adhesive tape.

An air gap AG can also be formed between the display panel 100 and the module cover 200 to receive a flow of air, for example. That is, the air gap AG can be a passage-way of the air. In addition, the air contained in the air gap AG can exchange heat with the display panel 100 and/or the module cover 200.

As shown, the module cover 200 includes a flat plate portion 210, a side wall 220, and a bent portion 230. The flat plate portion 210, the side wall 220, and the bent portion 230 may be integrally formed. Further, the flat plate portion 210 can be positioned behind the display panel 100 and provide rigidity to the display panel 100. The flat plate portion 210 thus can support the display panel 100 and protect the rear surface of the display panel 100. The flat plate portion 210 also has a flat shape with a first thickness T1. The flat plate portion 210 can also be referred to as a bottom portion 210.

Further, the side wall 220 can be positioned forward with respect to the flat plate portion 210 and be extended from edges of the flat plate portion 210. The side wall 220 is also bent toward the front of the flat plate portion 210 from the edges of the flat plate portion 210 faces and faces a lateral side of the display panel 100. In addition, the lateral side of the display panel 100 can correspond to at least one of an upper side, a lower side, a left side, and a right side of the display panel 100. The side wall 220 faces a lateral surface of the display panel 100.

The lateral surface of the display panel 100 can correspond to at least one of an upper surface, a lower surface, a left surface, and a right surface of the display panel 100. Further, the side wall 220 can protect the lateral side or surface of the display panel 100. The side wall 220 may have a flat shape with a second thickness T2. The thickness of the side wall 220 can be substantially the same as the thickness of the flat plate portion 210. That is, the second thickness T2 can be substantially equal to the first thickness T1. For example, the second thickness T2 may be 1.0 mm to 1.2 mm.

As shown, the bent portion 230 can be positioned between the flat plate portion 210 and the side wall 220. In particular, the bent portion 230 connects the flat plate portion 210 and the side wall 220. For example, the bent portion 230 is extended from the flat plate portion 210 and is connected to the side wall 220. The bent portion 230 thus can have a curved shape. Further, the bent portion 230 is bent toward the front of the flat plate portion 210 from an edge of the flat plate portion 210. Also, the thickness of the bent portion 230 may be a third thickness T3 that is substantially the same as the second thickness T2.

In addition, the bent portion 230 can be formed by bending an edge portion of the flat plate portion 210. In this process, stress may be generated in the bent portion 230. In particular, the stress generated at the bent portion 230 is related to the degree of bending of the bent portion 230. For example, the stress generated at the bent portion 230 has a positive correlation with the bent degree of the bent portion 230. As the degree of bending of the bent portion 230 is greater, the bent portion 230 is smaller.

Further, the module cover 200 includes a plurality of layers. For example, the module cover 200 includes a first layer 201, a second layer 202, and a third layer 203. The heat expansion coefficient of the first layer 201 may be greater than the heat expansion coefficient of the second layer 202, and the heat expansion coefficient of the third layer 203 may be substantially the same as the heat expansion coefficient of the first layer 201.

As shown, the flat plate portion 210 includes a flat plate portion first layer 201F, a flat plate portion second layer 202F, and a flat plate portion third layer 203F. Also, the side wall 220 includes a side wall first layer 201S, a side wall second layer 202S, and a side wall third layer 203S. The bent portion 230 includes a bent portion first layer 201B, a bent portion second layer 202B, and a bent portion third layer 203B.

In addition, the first layer 201 is adjacent to the display panel 100. Also, the third layer 203 can form a rear surface and an outer lateral surface of the display unit 20, and the second layer 202 may be located between the first layer 201 and the third layer 203. The first to third layers 201, 202, and 203 include, for example, a metal.

Further, the first layer 201 faces the display panel 100 and is exposed to outside air. Thus, the first layer 201 preferably includes a material resistant to corrosion. For example, the first layer 201 may include aluminum such as an alloy of aluminum and manganese. The thickness of the first layer 201 may be 0.25 mm to 0.3 mm.

In addition, the first layer 201 can receive heat from the display panel 100 and emit the heat of the display panel 100 to the outside. Thus, the first layer 201 preferably includes a material having a high thermal conductivity. For example, the first layer 201 may include an aluminum alloy.

The third layer 203 forms an appearance at the rear surface and/or the lateral surface of the display unit 20. Here, the lateral surface can correspond to at least one of an upper surface, a lower surface, a left surface, and a right surface. The third layer 203 may be exposed to outside air. The third layer 203 may also include a substance resistant to corrosion. For example, the third layer 203 may include aluminum.

In more detail, the material of the third layer 203 may be substantially the same as the material of the first layer 201. Also, the thickness of the third layer 203 may be substantially equal to the thickness of the first layer 201. For example, the thickness of the third layer 203 may be 0.25 mm to 0.3 mm.

In addition, the second layer 202 is located between the first layer 201 and the third layer 203 and couples the first layer 201 with the third layer 203. For example, the second layer 202 can be coupled to the first and third layers 201 and 203 by heat and/or pressure.

Further, the second layer 202 is generally not exposed to the outside except for the fracture surface 200C1. The second layer 202 also contributes to the rigidity of the module cover 200. For example, the second layer 202 may include a material having a high rigidity. For example, the second layer 202 may include stainless steel.

As shown, the first layer 201 includes the flat plate portion first layer 201F, the side wall first layer 201S, and the bent portion first layer 201B. The flat plate portion first layer 201F faces the display panel 100, and the bent portion first layer 201B is extended from the flat plate portion first layer 201F and is bent toward the front of the display panel 100. In addition, the side wall first layer 201S is extended toward the front of the display panel 100 from the bent portion first layer 201B and faces a lateral surface or lateral side of the display panel 100.

Further, the second layer 202 includes the flat plate portion second layer 202F, the side wall second layer 202S, and the bent portion second layer 202B. The flat plate portion second layer 202F can be positioned on the rear surface of the flat plate portion first layer 201F. The bent portion second layer 202B extends from the flat plate portion second layer 202F and is bent toward the front of the display panel 100. Also, the side wall second layer 202S is extended toward the front of the display panel 100 from the bent portion second layer 202B.

In addition, the third layer 203 includes the flat plate portion third layer 203F, the side wall third layer 203S, and the bent portion third layer 203B. The flat plate portion third layer 203F can be positioned on the rear surface of the flat plate portion second layer 202F and form the rear surface of the display unit 20. The bent portion third layer 203B extends from the flat plate portion third layer 203F and is bent toward the front of the display panel 100. Also, the side wall third layer 203S extends toward the front of the display panel 100 from the bent portion third layer 203B and forms a part of the outer appearance of the display unit 20. For example, the side wall third layer 203S can form a left/right outer appearance and/or an upper/lower outer appearance of the display unit 20.

Further, the side wall 220 can form a fracture surface 200C1 that faces the front of the display panel 100. The fracture surface 200C1 may have a flat shape and includes a cross section of a first layer 201, a second layer 202, and a third layer 203. The fracture surface 200C1 also forms an end of the side wall 220 and/or an end of the module cover 200.

In addition, the fracture surface 200C1 can be exposed to the outside air and thus a layer for preventing corrosion can be formed on the fracture surface 200C1. The layer for preventing corrosion may be transparent, and the boundary between the fracture surface 200C1 and the outer surface can be angulated. However, the angulated boundary of the fracture surface 200C1 may cause safety problems.

Figure 7:
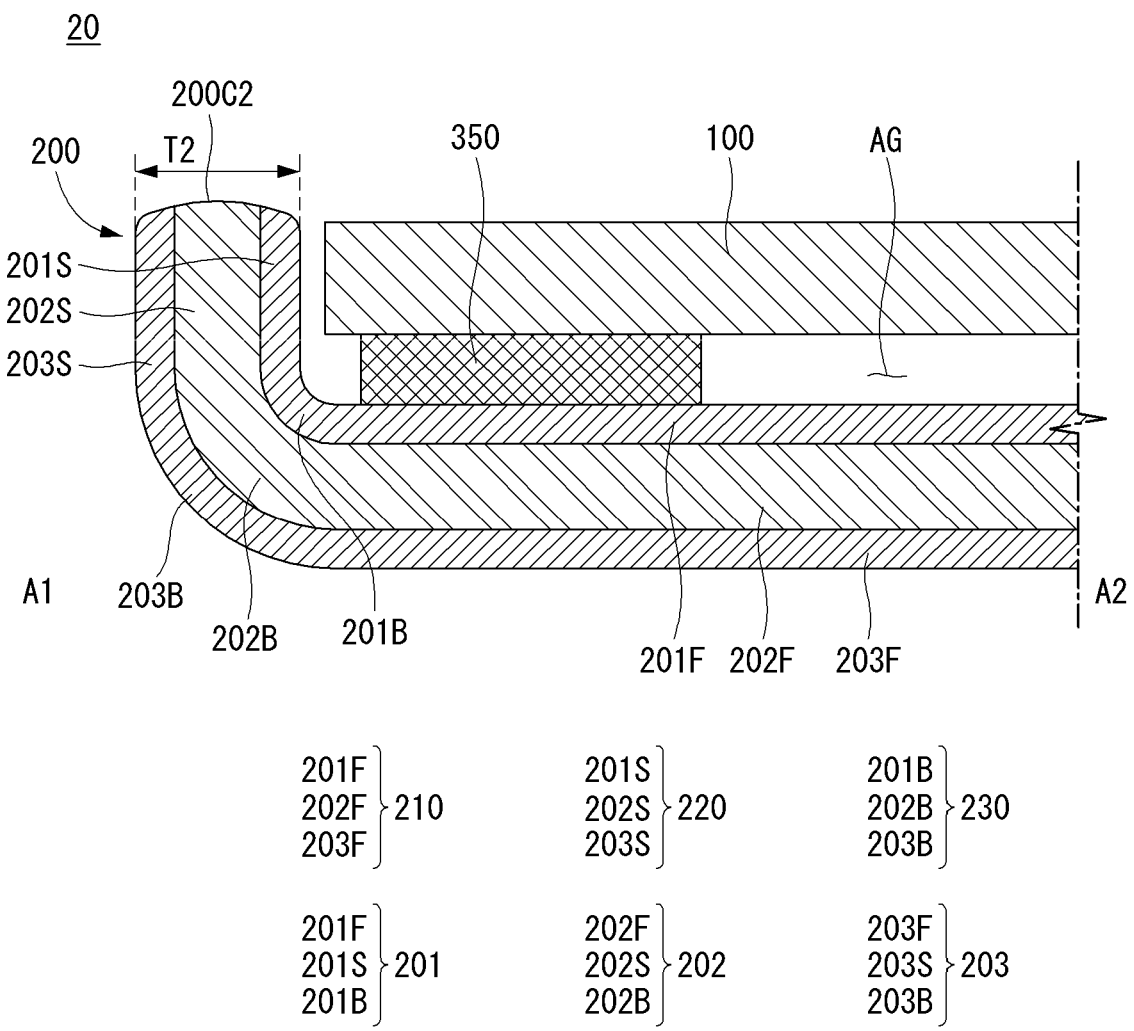

Therefore, referring to FIG. 7, the side walls 220 can form the treated surface 200C2. In particular, the treated surface 200C2 can be formed by processing the fracture surface 200C1 (see FIG. 6). The treated surface 200C2 can also face the front of the display panel 100 as a whole and be convex toward the front of the display panel 100. The boundary between the treated surface 200C2 and the outer surface can also be rounded. The treated surface 200C2 can form an end of the side wall 220 and/or an end of the module cover 200.

The treatment of the fracture surface (200C1, see FIG. 6) may include chemical treatment, mechanical treatment, and optical treatment. The chemical treatment of the fracture surface (200C1, see FIG. 6) refers to a process of cutting the fracture surface (200C1, see FIG. 6) using an etching solution or a radical. The chemical treatment of the fracture surface 200C1 (see FIG. 6) includes plasma processing. Plasma particles having high energy can cut or smooth or polish the fracture surface (200C1, see FIG. 6). Also, the optical processing of the fracture surface 200C1 (see FIG. 6) corresponds to a process of cutting the fracture surface 200C1 (see FIG. 6) using a laser, for example.

Further, the mechanical treatment of the fracture surface 200C1 (see FIG. 6) includes a process of wearing out the fracture surface 200C1 (see FIG. 6) using a material having a rigidity higher than that of the module cover 200. For example, a blade made of a reinforced metal can be used to wear the fracture surface 200C1 (see FIG. 6).

Figure 8:
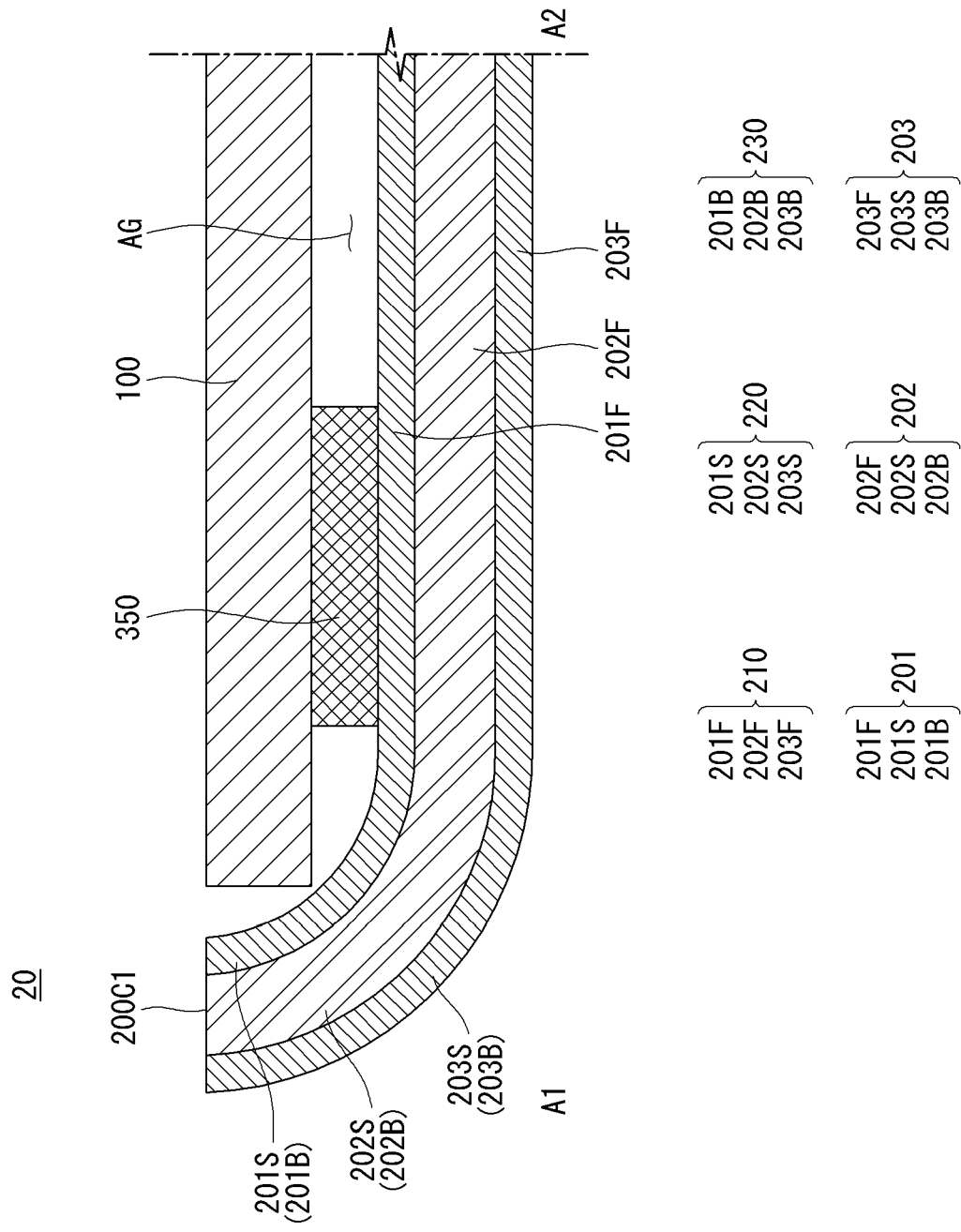

Referring to FIG. 8, the bent portion 230 extends from the flat plate portion 210 and is bent toward the front of the display panel 100. The bent portion 230 also faces the lateral side or the lateral surface of the display panel 100. The lateral side (the lateral surface) of the display panel 100 can correspond to the upper side (the upper surface), the lower side (the lower surface), the left side (the left surface), and the right side (the right surface) of the display panel 100. The bent portion 230 can thus protect the lateral side (lateral surface) of the display panel 100.

Further, the bent portion 230 of the module cover 200 can be referred to as a side wall 220 of the module cover 200, with regard to the aspect that the bent portion 230 faces the lateral side of the display panel 100. The bent portion first layer 201B can be referred to as a side wall first layer 201S, and the bent portion second layer 202B can be referred to as a side wall second layer 202S. Also, the bent portion third layer 203B can be referred to as a side wall third layer 203S.

In addition, the bent portion 230 can form a fracture surface 200C1. In particular, the fracture surface 200C1 can face the front of the display panel 100 and have a flat shape. The degree of bending of the bent portion 230 is described with FIG. 6. Further, the bent portion shown in FIG. 6 can be positioned between the flat plate portion 210 and the side wall 220, have a relatively small radius of curvature, and have a relatively large curvature. The degree of bending of the bent portion 230 shown in FIG. 6 can also be relatively large and thus have a relatively large stress.

In addition, the bent portion 230 shown in FIG. 8 faces a lateral side (or lateral surface) of the display panel 100 and can have a relatively large radius of curvature. The bent portion 230 shown in FIG. 8 may also have a relatively small curvature. Further, the degree of bending of the bent portion 230 shown in FIG. 8 may be relatively small. The bent portion 230 shown in FIG. 8 may have a relatively small stress, and have relatively high resistance to external impact.

Figure 9:
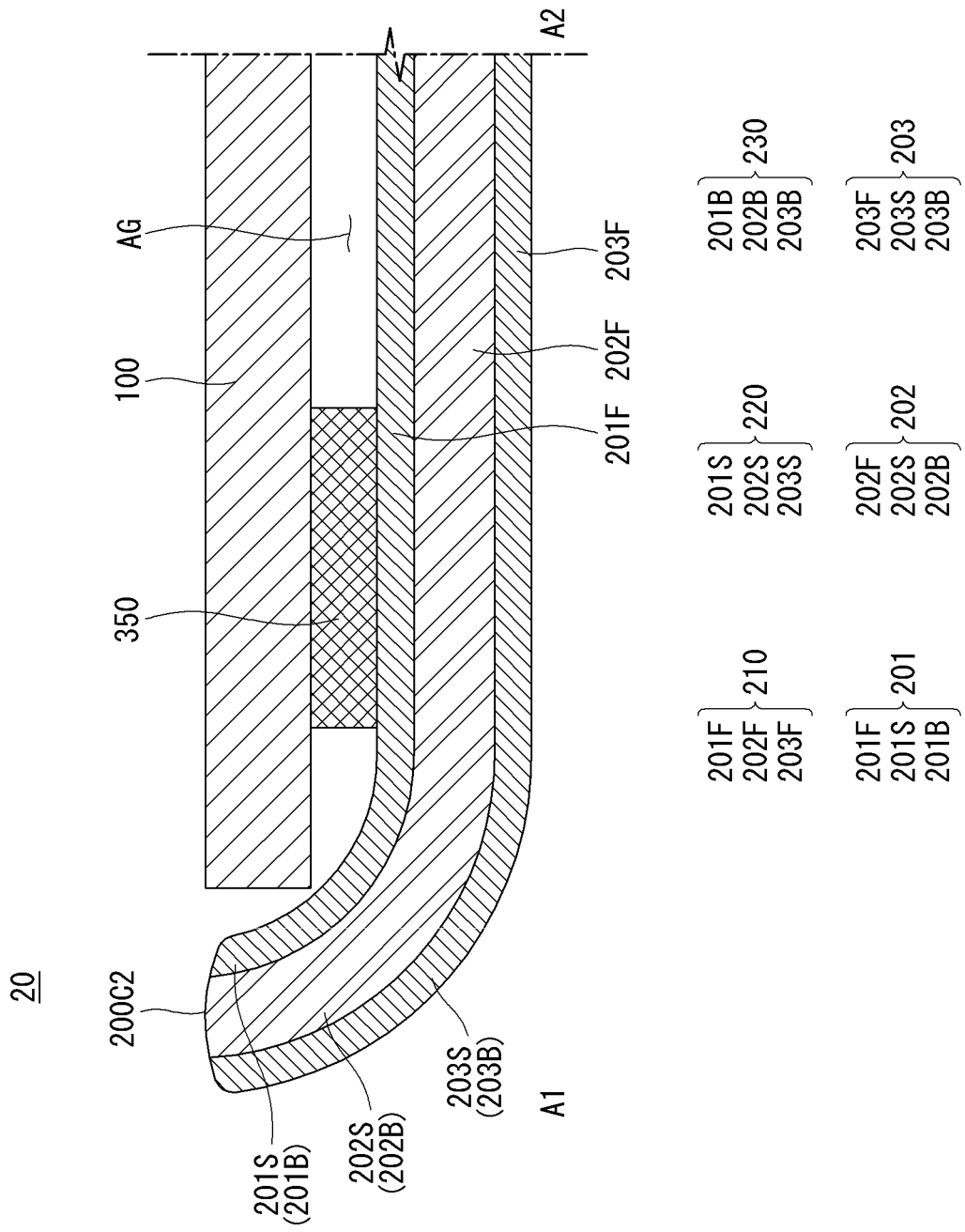

Referring to FIG. 9, the bent portion 230 can form the treated surface 200C2. In particular, the treated surface 200C2 can be formed by treating the fracture surface 200C1 (see FIG. 8). The treated surface 200C2 can also face the front of the display panel 100 as a whole. In addition, the treated surface 200C2 shown in FIG. 9 may have substantially the same properties as the treated surface 200C2 shown in FIG. 7.

Figure 10:
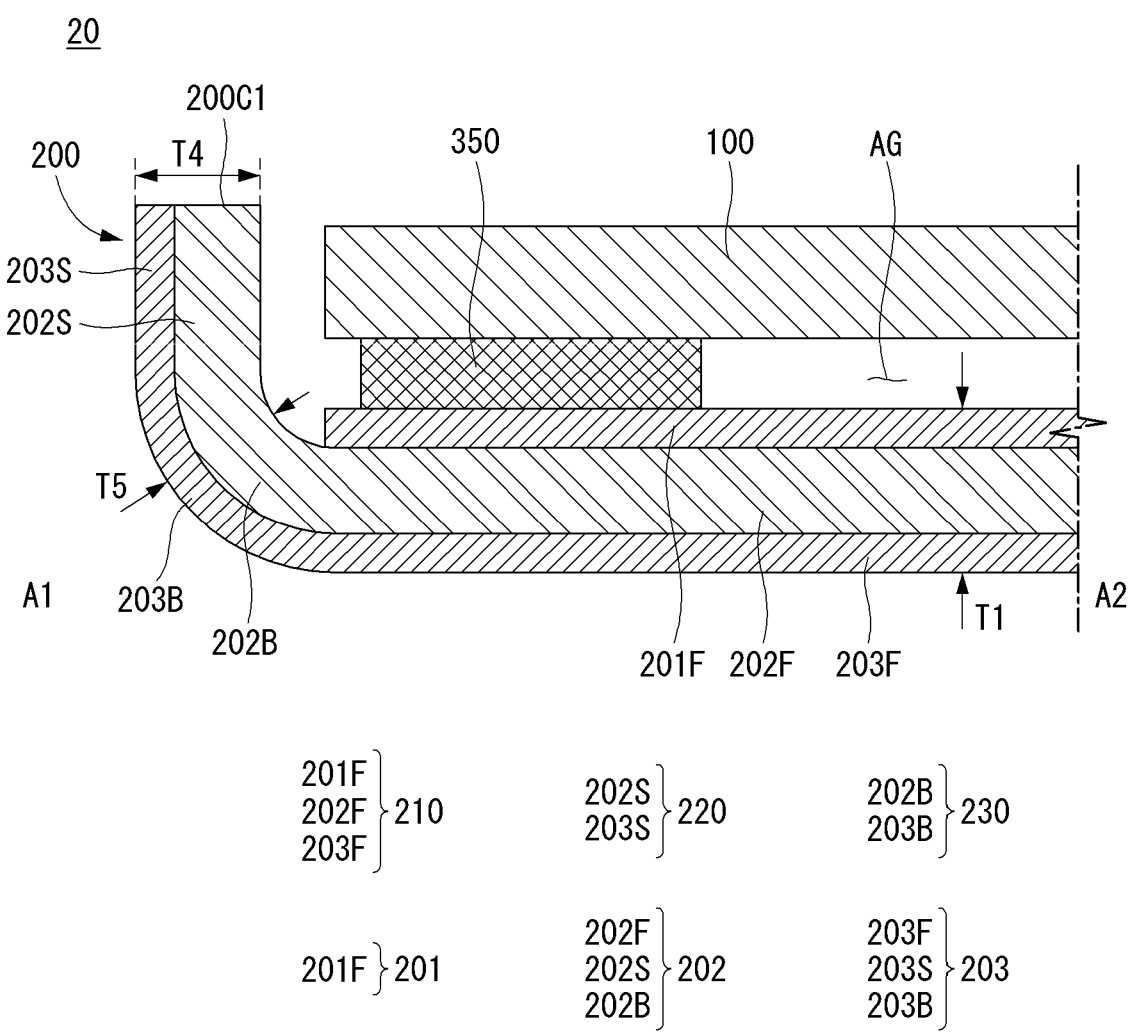

Referring to FIG. 10, the flat plate portion 210 and the side wall 220 includes a plurality of layers. Further, the layer structure for forming the side wall 220 may be different from the layer structure for forming the flat plate portion 210. For example, the flat plate portion 210 can have a layered structure of the first to third layers 201, 202, and 203, and the side wall 220 can have a layered structure of the second and third layers 202 and 203.

For example, the flat plate portion 210 includes a flat plate portion first layer 201F, a flat plate portion second layer 202F, and a flat plate portion third layer 203F. Also, the side wall 220 includes a side wall second layer 202S and a side wall third layer 203S and does not include a side wall first layer 201A. Thus, the side wall 220 is thinner and can bend easier because the side wall 220 only has two layers rather than three layers. In addition, the bezel area is smaller and thinner. In addition, the manufacturing process is simpler. Also, the space between the edge of the display panel 100 and the side wall 220 is greater than when the side wall 220 includes the side wall first layer 210A. Thus, heat can escape easier.

In addition, the thickness of the flat plate portion 210 can be referred to as a first thickness T1 and the thickness of the side wall 220 referred to as the fourth thickness T4. The first thickness T1 can also be greater than the fourth thickness T4. For example, the first thickness T1 may be 1.0 mm to 1.2 mm and the fourth thickness T4 may be 0.75 mm to 0.9 mm. The thickness of the bent portion 230 can also be the fifth thickness T5 which can be substantially the same as the fourth thickness T4.

Further, the thickness of the side wall 220 can be described in comparison with FIG. 6. For example, the fourth thickness T4 can be smaller than the second thickness T2 (see FIG. 6). Thus, the thickness of the bezel of the display unit 20 according to the embodiment of the present invention shown in FIG. 10 is smaller than the thickness of the bezel of the display unit 20 according to the embodiment of the present invention shown in FIG. 6. The visibility of the display unit 20 according to the embodiment of the present invention shown in FIG. 10 is better than the visibility of the display unit 20 according to the embodiment of the present invention shown in FIG. 6.

In addition, the thickness of the bent portion 230 can be described in comparison with FIG. 6. For example, the fifth thickness T5 can be smaller than the third thickness T3 (see FIG. 6). Thus, the stress formed in the bent portion 230 shown in FIG. 10 is smaller than the stress formed in the bent portion 230 shown in FIG. 6. In addition, the durability of the module cover 200 according to the embodiment of the present invention shown in FIG. 10 is generally higher than the durability of the module cover 200 according to the embodiment of the present invention shown in FIG. 6. The manufacturing of the bent portion 230 shown in FIG. 10 can also be facilitated compared with the manufacturing of the bent portion 230 shown in FIG. 6.

Further, the fracture surface 200C1 can be formed on the side wall 220 and face the front of the display panel 100. The fracture surface 200C1 can be turned into treated surface 200C2 (see FIG. 7) through at least one of mechanical treatment, chemical treatment, and optical treatment. The properties of the fracture surface 200C1 shown in FIG. 10 are similar to those of the fracture surface 200C1 shown in FIG. 6.

Figure 11:
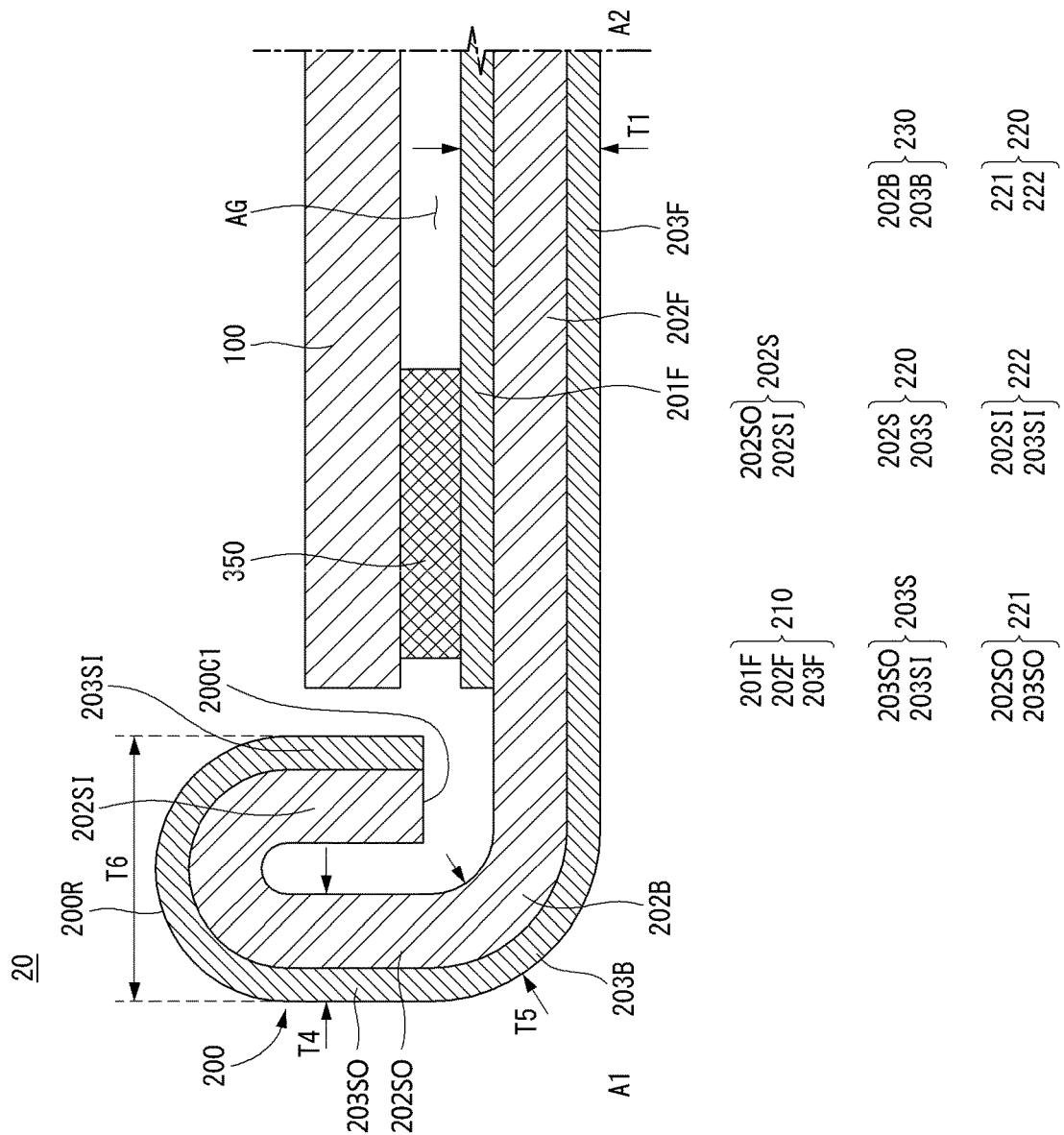

Referring to FIG. 11, the side wall 220 includes an outer side wall 221 and an inner side wall 222. The total thickness of the side wall 220 may be a sixth thickness T6. In addition, the side wall 220 extends from the bent portion 230, and the bent portion 230 extends from the flat plate portion 210. As the side wall 220 includes the outer side wall 221 and the inner side wall 222, the side wall 220 can stably protect the lateral side (lateral surface) of the display panel 100.

Further, the flat plate portion 210 can be formed by stacking first to third layers 201, 202, and 203. The thickness of the flat plate portion 210 can also be the first thickness T1. In addition, the bent portions 230 can be formed by stacking the second and third layers 202 and 203 and bending the flat plate portion 210 toward the front of the display panel 100. The thickness of the bent portion 230 can also be a fifth thickness T5. As shown, the outer side wall 221 extends from the bent portion 230.

The outer side wall 221 forms an appearance of lateral side (lateral surface) of the display unit 20. In addition, the lateral side (lateral surface) of the display unit 20 includes at least one of an upper side (upper surface), a lower side (lower surface), a left side (left surface), and a right side (right surface) of the display unit 20. Also, the outer side wall 221 includes an outer side wall second layer 202SO and an outer side wall third layer 203SO. The thickness of the outer side wall 221 can be a fourth thickness T4.

In addition, the inner side wall 222 extends from the outer side wall 221 and includes an inner side wall second layer 202SI and an inner side wall third layer 203SI. As shown, the inner side wall second layer 202SI extends from the outer side wall second layer 202SO. Further, the inner side wall third layer 203SI extends from the outer side wall third layer 203SO.

The inner side wall 222 can be positioned between the outer side wall 221 and the display panel 100. Further, the thickness of the inner side wall 222 may be substantially the same as the thickness of the outer side wall 221. For example, the thickness of the inner side wall 222 may be the fourth thickness T4.

In addition, the fracture surface 200C1 can form the end of the side wall 220 and/or the end of the module cover 200. The fracture surface 200C1 also faces the flat plate portion 210 and/or the display panel 100. For example, the fracture surface 200C1 can face the flat plate portion 210. The inner side wall 222 is also directed to the rear of the display panel 100.

In addition, the side wall connection portion 200R can connect the inner side wall 222 and the outer side wall 221. In more detail, the side wall connection portion 200R may be convex toward the front of the display panel 100. The side wall connection portion 200R may also be a surface facing the front of the display panel 100 among the outer surface of the side wall 220. Further, the side wall connection portion 200R may be a surface viewed from the front of the display panel 100 among the outer surface of the side wall 220 and may have a curved shape.

Figure 12:
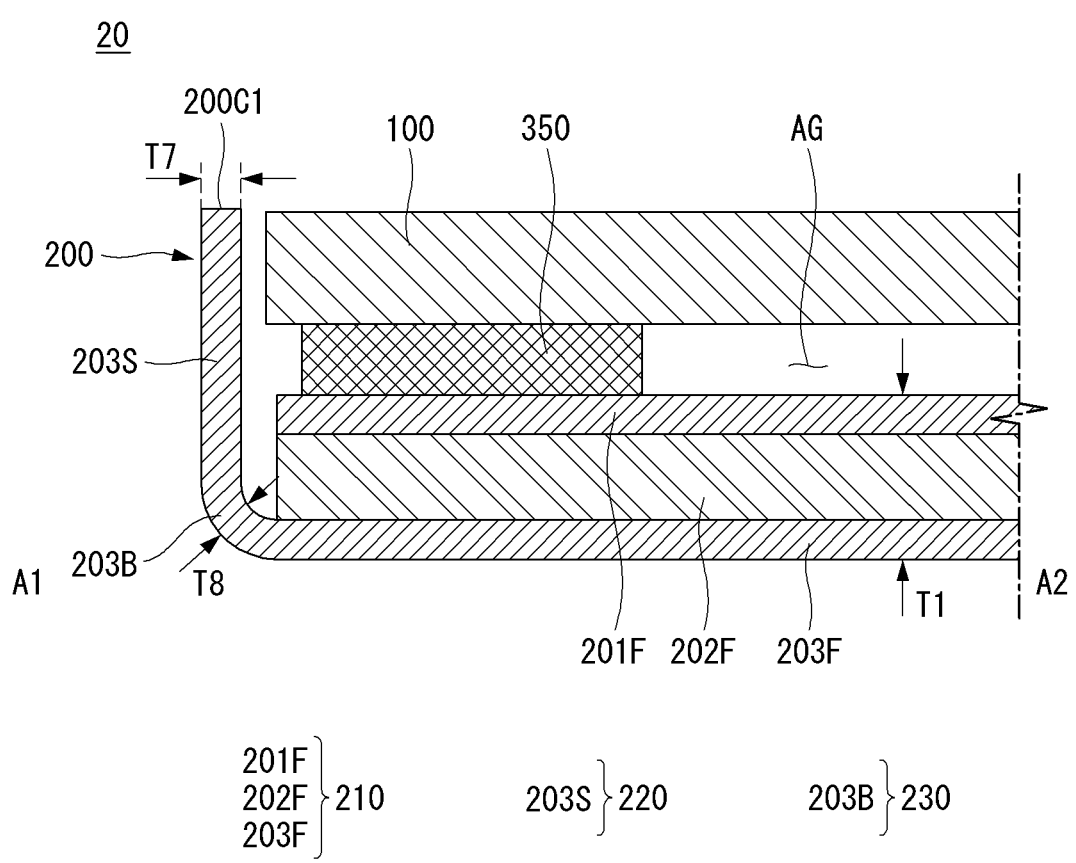

Referring to FIG. 12, the layer structure for forming the side wall 220 can be different from the layer structure for forming the flat plate portion 210. For example, the flat plate portion 210 can have a multiple-layer structure such as a laminated structure (or layered structure) of the first to third layers 201, 202, and 203. The side wall 220 can also have a single layer structure.

In addition, the thickness of the flat plate portion 210 may be the first thickness T1. The flat plate portion 210 also includes the flat plate portion first layer 201F, the flat plate portion second layer 202F, and the flat plate portion third layer 203F.

Further, the bent portion 230 can be formed by bending the flat plate portion 210 toward the front of the display panel 100. The bent portion 230 may have a single layer structure. For example, the bent portion 230 includes the bent portion third layer 203B. The bent portion 230 also extends from the flat plate portion third layer 203F.

As shown, the side wall 220 extends from the bent portion 230 and includes a side wall third layer 203S. Further, the side wall 220 extends from the bent portion third layer 203B. The thickness of the side wall 230 may be a seventh thickness T7, which is substantially equal to an eighth thickness T8. For example, the seventh thickness T7 may be 0.25 mm to 0.3 mm.

In addition, the thickness of the bezel of the display unit 20 according to the embodiment of the present invention shown in FIG. 12 is smaller than the thickness of the bezel of the display unit 20 according to the embodiment of the present invention shown in FIG. 10. The visibility of the display unit 20 according to the embodiment of the present invention shown in FIG. 12 is also improved compared to the visibility of the display unit 20 according to the embodiment of the present invention shown in FIG. 10.

Further, the thickness of the bent portion 230 can be described in comparison with FIG. 10. That is, the thickness of the bent portion 230 may be the eighth thickness T8. The eighth thickness T8 can also be substantially the same as the thickness of the third layer 203. For example, the eighth thickness T8 may be 0.25 mm to 0.3 mm and be smaller than the fifth thickness T5 (see FIG. 10). Thus, the stress formed in the bent portion 230 shown in FIG. 12 is smaller than the stress formed in the bent portion 230 shown in FIG. 10. The durability of the module cover 200 according to the embodiment of the present invention shown in FIG. 12 is also higher than the durability of the module cover 200 according to the embodiment of the present invention shown in FIG. 10. Further, the manufacturing of the bent portion 230 shown in FIG. 12 can be facilitated in comparison with the manufacturing of the bent portion 230 shown in FIG. 10.

In addition, the fracture surface 200C1 can be formed at the side wall 220 and can face the front of the display panel 100. The fracture surface 200C1 can be processed to become the treated surface 200C2 (see FIG. 7). The properties of the fracture surface 200C1 shown in FIG. 12 may be similar to those of the fracture surface 200C1 shown in FIG. 10.

Figure 13:
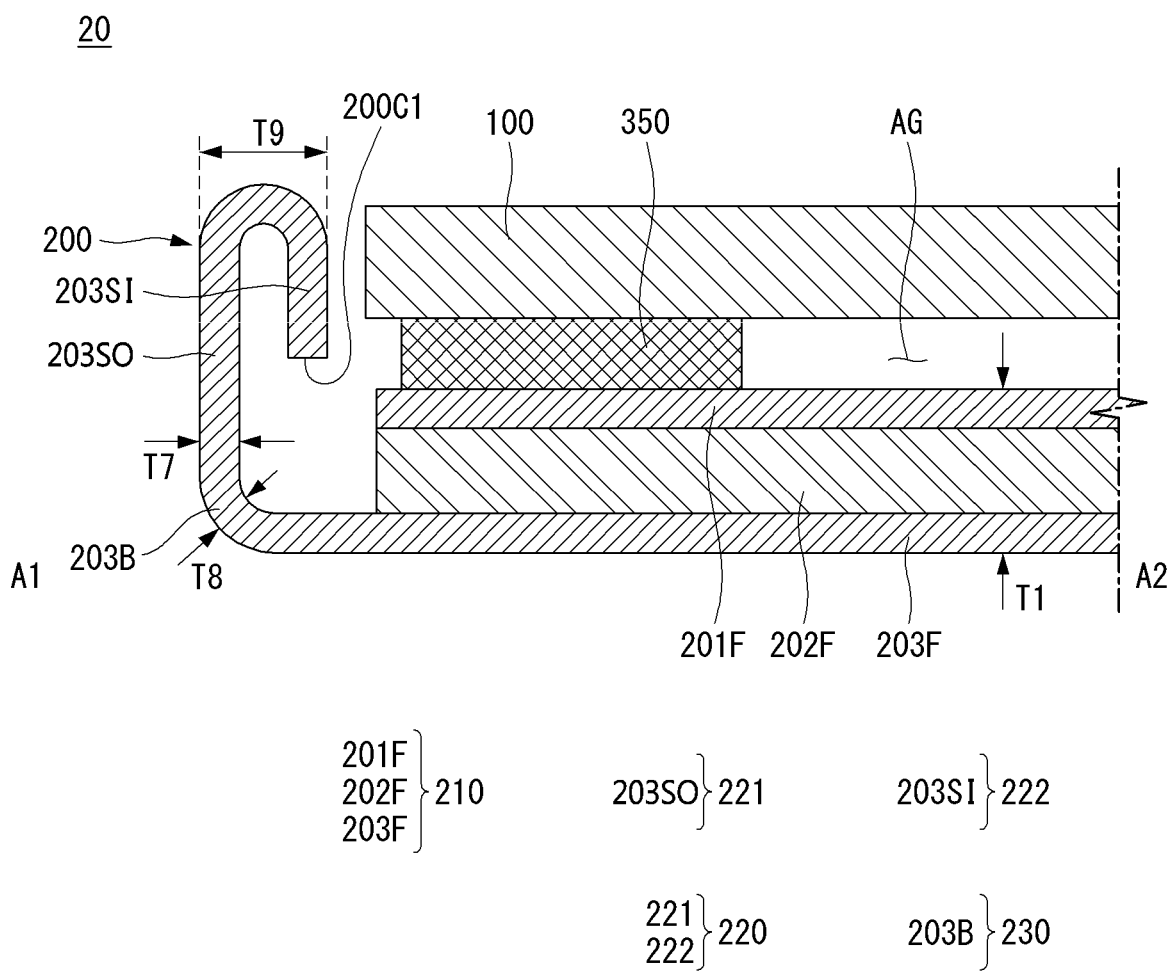

Referring to FIG. 13, the side wall 220 includes an outer side wall 221 and an inner side wall 222. As shown, the inner side wall 222 extends from the outer side wall 221 and is positioned between the outer side wall 221 and the display panel 100. As the side wall 220 includes the outer side wall 221 and the inner side wall 222, the side wall 220 can stably protect the lateral side (or lateral surface) of the display panel 100.

Further, the total thickness of the side wall 220 may be a ninth thickness T9. In more detail, the total thickness of the side wall 220 corresponds to the sum of the thickness of the outer side wall 221 and the thickness of the inner side wall 222. In addition, the thickness of the outer side wall 221 may be a seventh thickness T7. The thickness of the inner side wall 222 can also be substantially the same as the thickness of the outer side wall 221. The thickness of the inner side wall 222 can thus be the seventh thickness T7. The ninth thickness T9 is also greater than twice the seventh thickness T7. For example, the ninth thickness T9 may be 0.8 mm to 0.9 mm.

In addition, the side wall 220 shown in FIG. 13 can be compared to the side wall 220 shown in FIG. 6. In more detail, the thickness of the side wall 220 shown in FIG. 6 may be 1.0 mm to 1.2 mm as the second thickness T2. The total thickness of the side wall 220 shown in FIG. 13 may be 0.8 mm to 0.9 mm as the ninth thickness T9. Thus, the side wall 220 shown in FIG. 13 can have a thin thickness compared to the side wall 220 shown in FIG. 6 while stably protecting the display panel 100.

In addition, the bent portion 230 shown in FIG. 13 can be compared with the bent portion 230 shown in FIG. 11. For example, the thickness of the bent portion 230 shown in FIG. 13 may be 0.25 mm to 0.3 mm as the eighth thickness T8, and the thickness of the bent portion 230 shown in FIG. 11 may be 0.75 mm to 0.9 mm as the fifth thickness T5.

Figure 14:
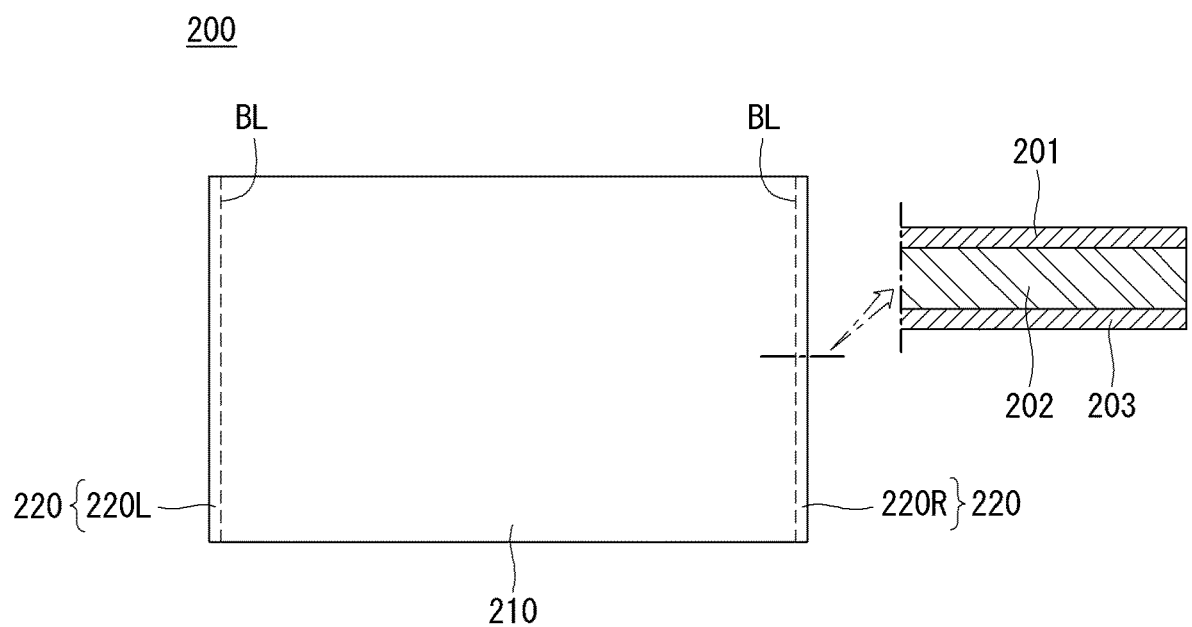
FIGS. 14 to 23 are views illustrating a module cover according to various embodiments of the present invention.

Referring to FIG. 14, a front surface of the module cover 200 according to an embodiment of the present invention can be observed. In more detail, the module cover 200 can be formed by stacking a plurality of metal layers. For example, the module cover 200 can be formed by stacking first to third layers 201, 202, and 203. The module cover 200 can also be manufactured by machining a metal plate formed by stacking a plurality of metal layers. The module cover 200 shown in FIG. 14 can also be a flat metal plate.

In addition, the dotted line BL shown in FIG. 14 indicates a part to be processed. For example, the dotted line BL shown in FIG. 14 indicates the portion to be bent and can be referred to as a bending line. As shown, the module cover 200 includes a flat plate portion 210 and a side wall 220. The side walls 220 may also be provided in plural. For example, the side wall 220 includes a left side wall 220L and a right side wall 220R. Also, the right side wall 220R can be referred to as a first side wall 220R, and the left side wall 220L can be referred to as a second side wall 220L.

Further, the left side wall 220L extends from the left side of the flat plate portion 210, and the right side wall 220R extends from the right side of the flat plate portion 210. In a state before the bending process, the flat plate portion 210 can be positioned between the left side wall 220L and the right side wall 220R. Also, the right side (or right edge) of the flat plate portion 210 may be opposite to the left side (or left edge) of the flat plate portion 210.

Figure 15:
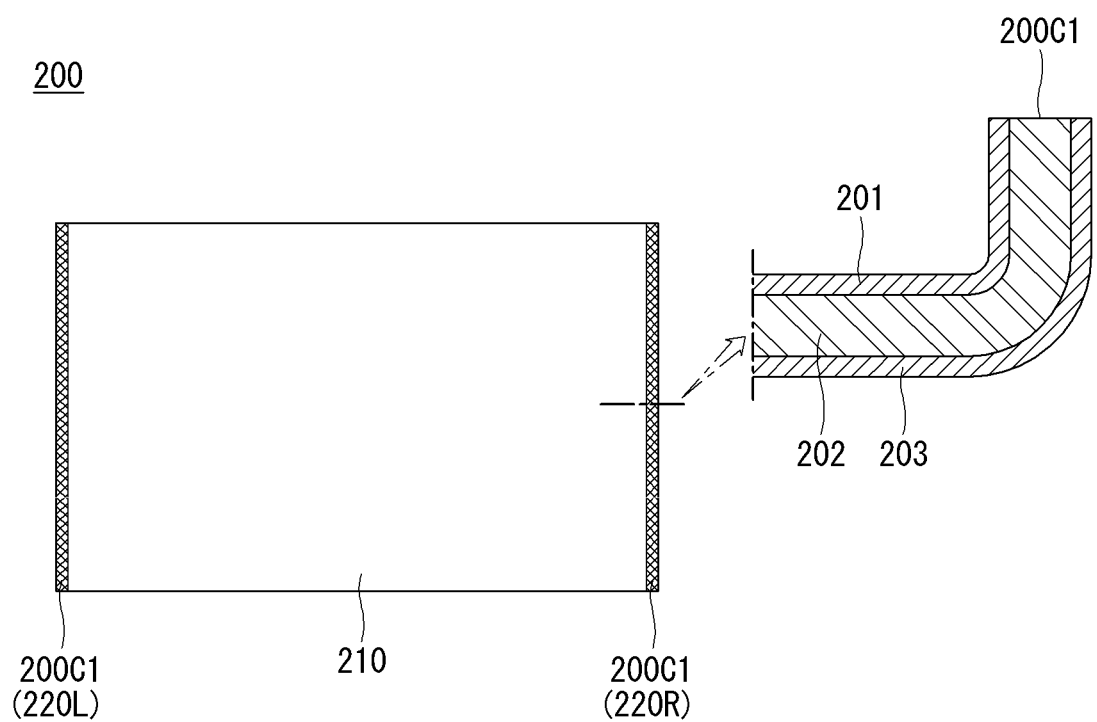

Referring to FIG. 15, a front surface of a flat plate portion 210 of a module cover 200 according to an embodiment of the present invention can be observed. As the left side wall 220L and the right side wall 220R shown in FIG. 14 are bent toward the front of the flat plate portion 210, the fracture surface 200C1 of the side wall 220 can be observed. The fracture surface 200C1 of the side wall 220 also faces the front of the flat plate portion 210.

In addition, the module cover 200 can form an internal space. In more detail, the internal space formed at the module cover 200 may be for accommodation. For example, the side wall 220 and the flat plate portion 210 can form the internal space. The internal space formed by the flat plate portion 210, the left side wall 220L and the right side wall 220R can be opened forward, upward, and downward of the flat plate portion 210. Thus, the display panel 100 (see FIG. 2) can be located in the internal space formed at the module cover 200.

Figure 16:
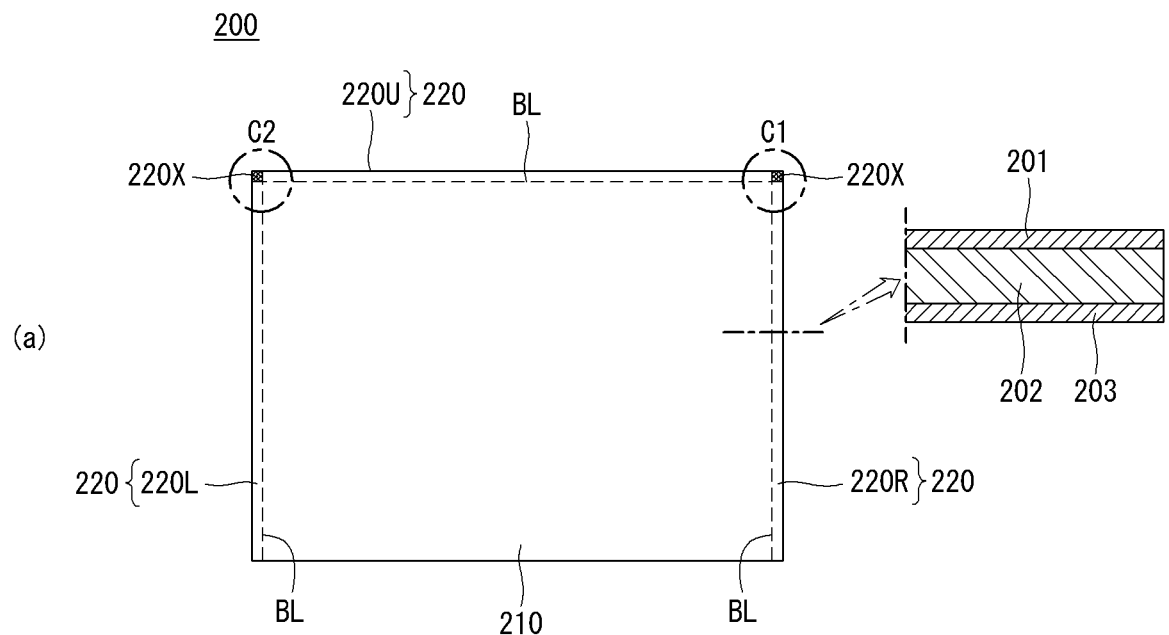
Figure 16:
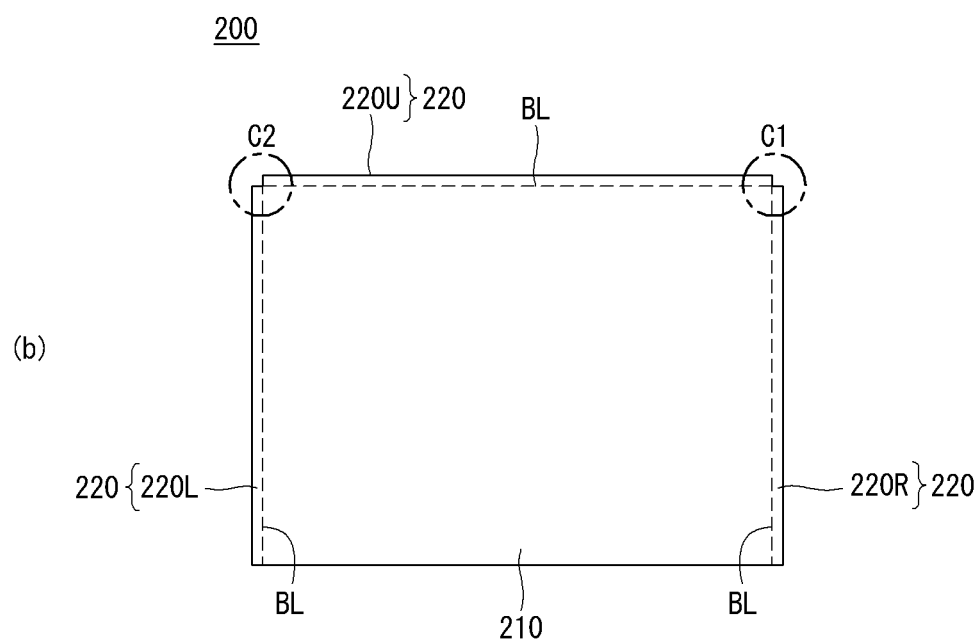

Referring to FIG. 16 (a), a front surface of the module cover 200 according to an embodiment of the present invention can be observed. The module cover 200 can be manufactured by processing a metal plate formed by stacking the first to third layers 201, 202, and 203. The module cover 200 shown in FIG. 16 can also be a flat metal plate.

In addition, the dotted line BL shown in FIG. 16 indicates the portion to be bent. The dotted line BL shown in FIG. 16 can be referred to as a bending line. Also, the module cover 200 includes a flat plate portion 210 and a side wall 220. The side walls 220 can also be provided in plural. For example, the side wall 220 includes a left side wall 220L, a right side wall 220R, and an upper side wall 220U. The upper side wall 220U can be referred to as a third side wall 220U.

As shown, the left side wall 220L extends from the left side of the flat plate portion 210, and the right side wall 220R extends from the right side of the flat plate portion 210. Further, the upper side wall 220U extends from the upper side of the flat plate portion 210. The upper edge of the flat plate portion 210 can connect the left edge and the right edge of the flat plate portion 210. Also, an area around the point where the upper edge and the right edge of the flat plate portion 210 meet can be referred to as a first corner C1. An area around the point where the upper edge and the left edge of the flat plate portion 210 meet can also be referred to as a second corner C2.

At the first corner C1 and the second corner C2, the overlapping areas 220X of the side wall 220 can be formed. That is, the overlapping area 220X can be formed, as a bending line BL meets another bending line BL. The overlapping area 220X of the side wall 220 can be overfolded through bending process. Referring to FIG. 16 (b), the overlapping area 220X of the side wall 220 can also be cut.

Figure 17:
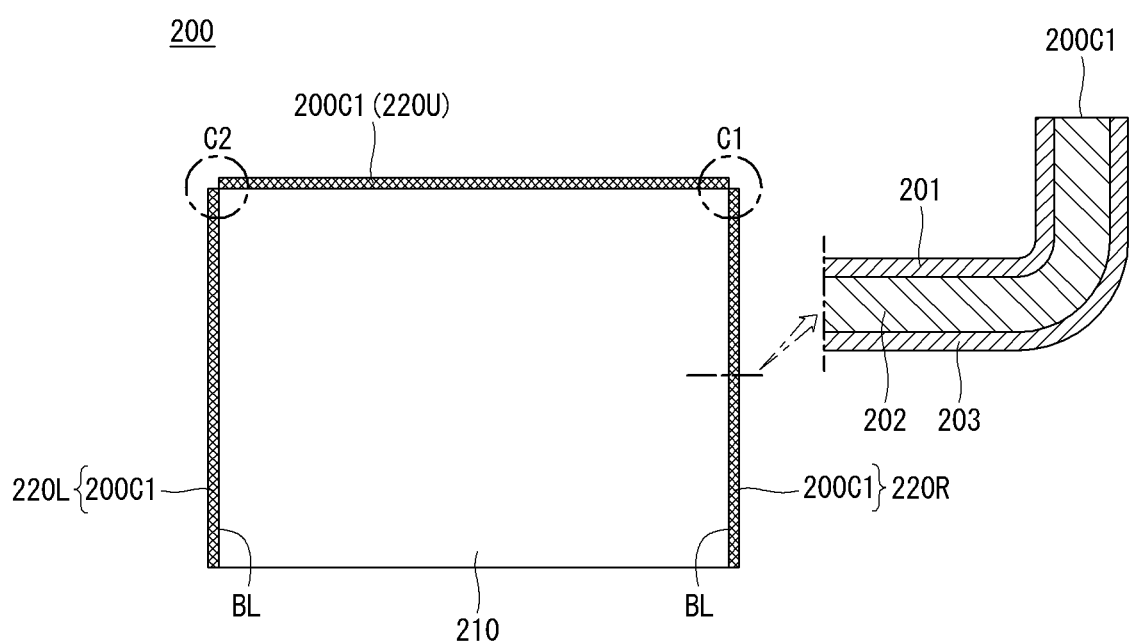

Referring to FIG. 17, a front surface of the flat plate portion 210 of the module cover 200 according to an embodiment of the present invention can be observed. As the side wall 220 shown in FIG. 16 is bent toward the front of the flat plate portion 210, the fracture surface 200C1 of the side wall 220 can be observed. The fracture surface 200C1 of the side wall 220 can face the front of the flat plate portion 210. In addition, the profile of the fracture surface 200C1 of the side wall 220 can be relatively uniform, as the overlapping areas 220X (see FIG. 16) has been removed.

Further, the module cover 200 can form an internal space. For example, the side wall 220 and the flat plate portion 210 can form the internal space. The internal space formed by the flat plate portion 210, the left side wall 220L, the right side wall 220R and the upper side wall 220U can be opened forward and the downward of the flat plate portion 210. Thus, the display panel 100 (see FIG. 2) can be located in the internal space formed in the module cover 200.

Figure 18:
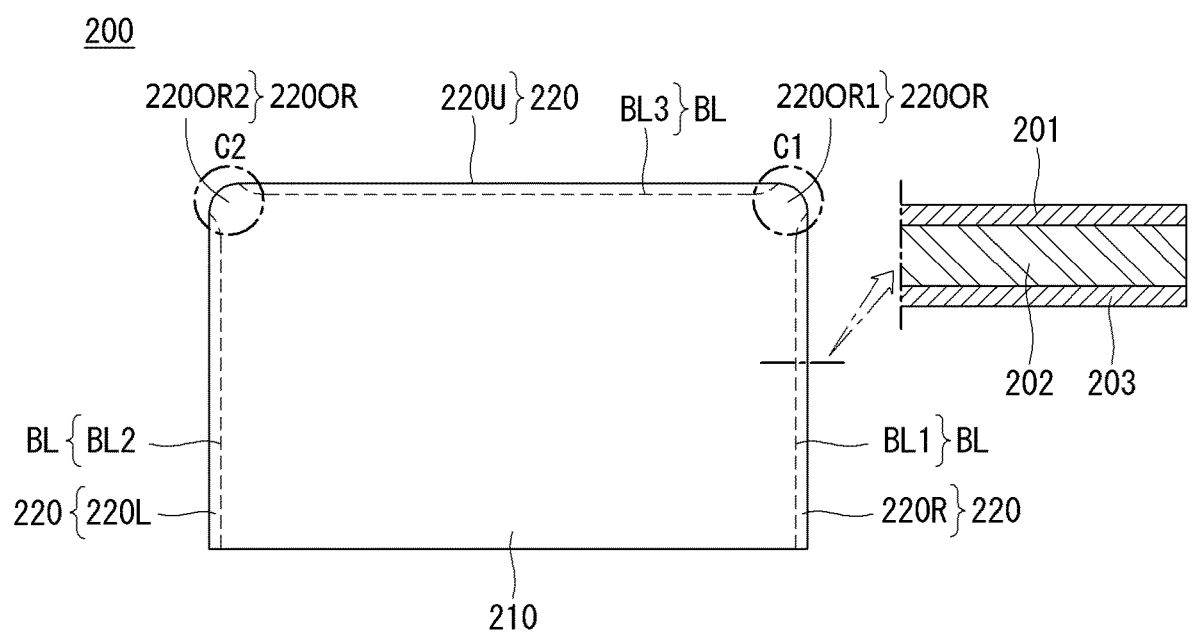

Referring to FIG. 18, a front surface of the module cover 200 according to an embodiment of the present invention can be observed. The module cover 200 can be manufactured by processing a metal plate formed by stacking the first to third layers 201, 202, and 203. The module cover 200 shown in FIG. 18 can be a flat metal plate.

Further, the dotted line BL shown in FIG. 18 can be referred to as a bending line BL. The bending lines BL shown in FIG. 18 can also be formed in plural. For example, the bending line BL includes a first bending line BL1, a second bending line BL2, and a third bending line BL3.

Referring to FIG. 18, a plurality of bending lines BL do not intersect with each other. That is, the bending lines BL can reach the edges of the module cover 200 at the corners C1 and C2 or at positions adjacent to the corners C1 and C2. Such a structure of the plurality of bending lines BL can prevent overfolding of the overlapping area 220X (see FIG. 16) of the side wall 220.

In addition, a first bending line BL1 can be located alongside of the right edge of the module cover 200, and a second bending line BL2 can be located alongside of the left edge of the module cover 200. Further, a third bending line BL3 can be located alongside of the upper edge of the module cover 200. The first bending line BL1 and the third bent line BL3 can also be adjacent to each other at the first corner C1. The first open region 220OR1 can be formed at the first corner C1 and can be located between the first bending line BL1 and the third bending line BL3. The first open region 220OR1 leads to the outer boundary of the flat plate portion 210. Also, the outer boundary of the flat plate portion 210 can correspond to the outer edge of the flat plate portion 210.

In addition, the second bending line BL 2 and the third bending line BL 3 can be adjacent to each other at the second corner C 2. The second open region 220OR2 can be formed at the second corner C2 and can be located between the second bending line BL2 and the third bending line BL3. Also, the second open region 220OR2 leads to the outer boundary of the flat plate portion 210 and can represent at least one of the first open region 220OR1 and the second open region 220OR2.

Figure 19:
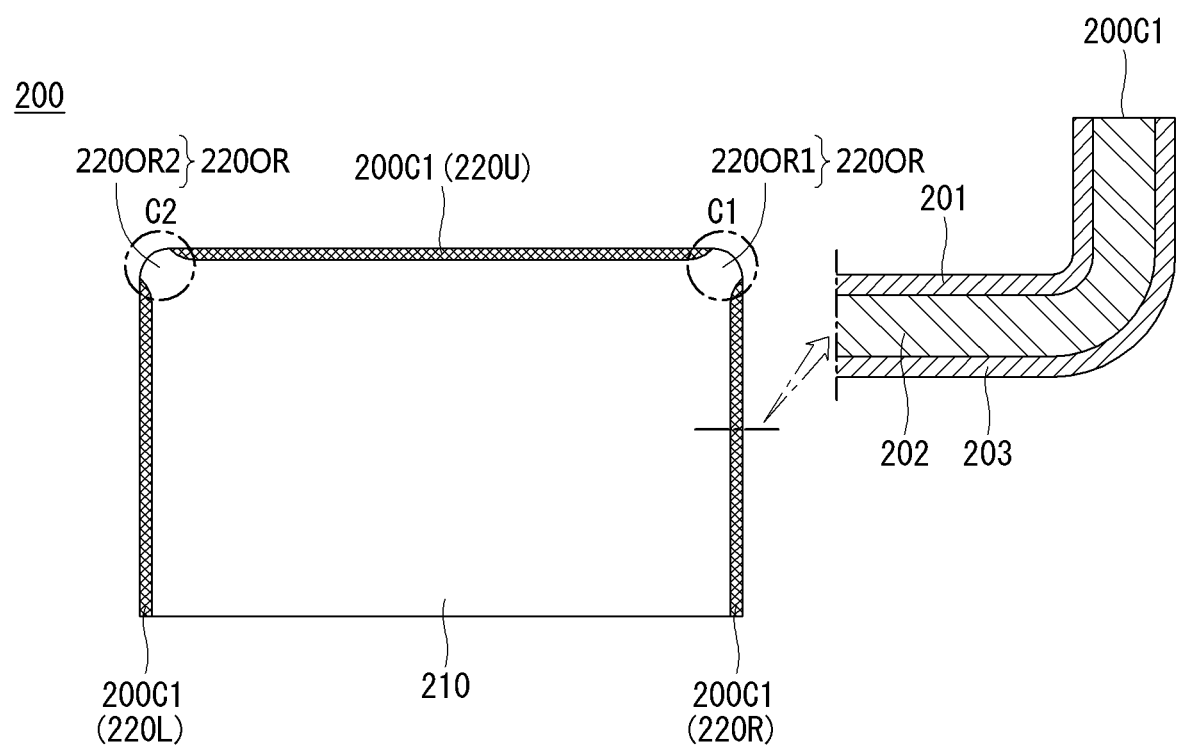

Referring to FIG. 19, a front surface of a flat plate portion 210 of a module cover 200 according to an embodiment of the present invention can be observed. As the side wall 220 shown in FIG. 18 is bent toward the front of the flat plate portion 210, the fracture surface 200C1 of the side wall 220 can be observed. The profile of the fracture surface 200C1 of the side wall 220 may also not be uniform. For example, the fracture surface 200C1 of the side wall 220 can be narrower as it goes to the corners C1 or C2.

In addition, the first open region 220OR1 can be formed at the first corner C1 and can be formed between the right side wall 220R and the upper side wall 220U. The first open region 220OR1 and the flat plate portion 210 can also share the same plane.

Further, the second open region 220OR2 can be formed at the second corner C2 and can be formed between the left side wall 220L and the upper side wall 220U. The second open region 220OR2 and the flat plate portion 210 can also share the same plane.

In addition, the module cover 200 can form an internal space. The internal space formed by the flat plate portion 210, the left side wall 220L, the right side wall 220R and the upper side wall 220U can be opened downward of the flat plate portion 210. The internal space formed by the module cover 200 can also communicate with the outside through the open region 220OR. Thus, the display panel 100 (see FIG. 2) can be located in the internal space formed in the module cover 200. Further, the open region 220OR can be opened toward an outside of the flat plate portion 210 in a lateral direction. The lateral direction includes left direction, right direction, upper direction, and lower direction.

Next, FIG. 20 will be explained in comparison with FIG. 16. The module cover 200 shown in FIG. 20 may be a flat metal plate and can be formed by stacking first to third layers 201, 202, and 203.

Figure 20:
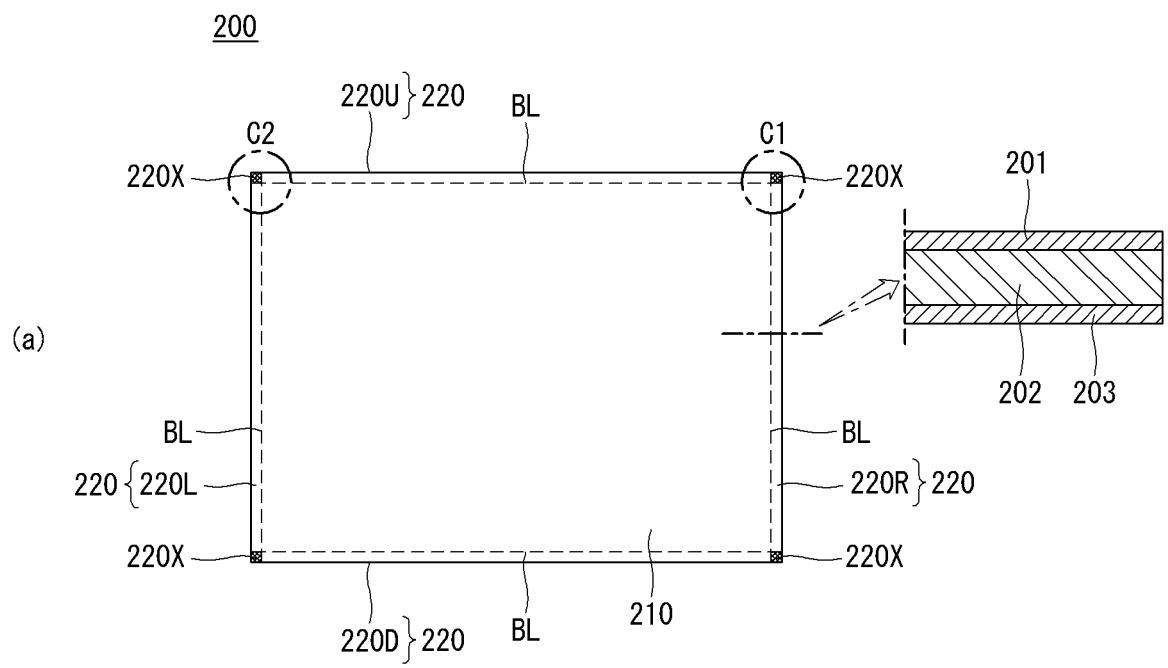
Figure 20:
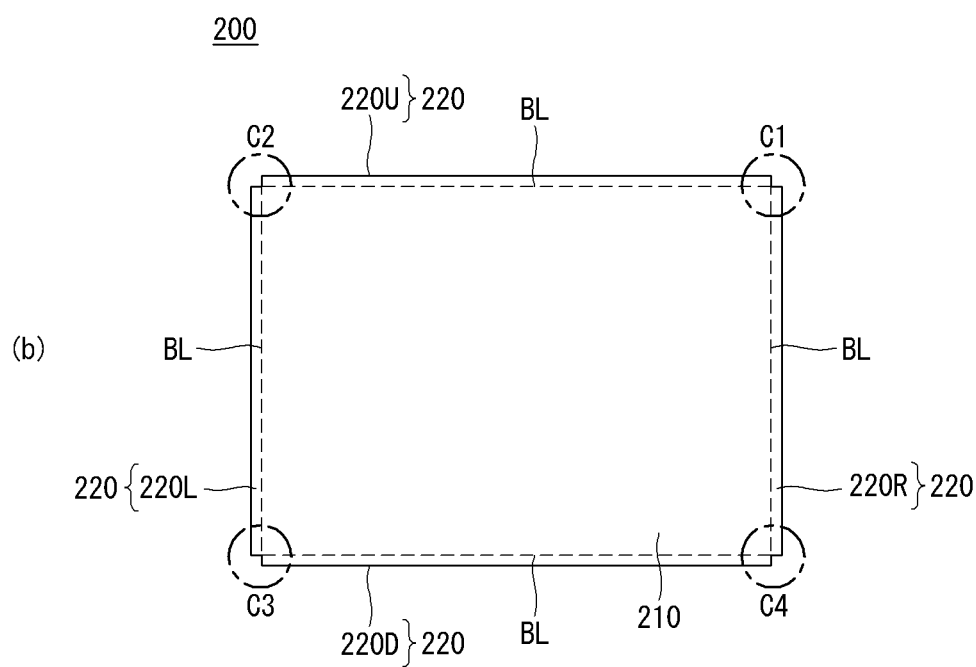

Referring to FIG. 20 (a), the module cover 200 includes a plurality of side walls 220. For example, the side wall 220 includes a left side wall 220L, a right side wall 220R, an upper side wall 220U, and a lower side wall 220D. The lower side wall 220D can be referred to as a fourth side wall 220D.

In addition, the left side wall 220L extends from the left side of the flat plate portion 210, and the right side wall 220L extends from the right side of the flat plate portion 210. Further, the upper side wall 220U extends from the upper side of the flat plate portion 210, and the lower side wall 220D extends from the lower side of the flat plate portion 210.

Further, the upper edge of the flat plate portion 210 can connect the left edge and the right edge of the flat plate portion 210. Also, a region adjacent to the point where the upper edge and the right edge of the flat plate portion 210 meet can be referred to as a first corner C1, and a region adjacent to the point where the upper edge and the left edge of the flat plate portion 210 meet can be referred to as a second corner C2.

In addition, the lower edge of the flat plate portion 210 can be located opposite to the upper edge of the flat plate portion 210. The lower edge of the flat plate portion 210 can also connect the left edge and the right edge of the flat plate portion 210. Further, the region adjacent to the point where the lower edge and the left edge of the flat plate portion 210 meet can be referred to as a third corner C3, and the region adjacent to the point where the lower edge and the right edge of the flat plate portion 210 meet can be referred to as a fourth corner C4.

Overlapping areas 220X of the side wall 220 can be formed at the first to fourth corners C1 to C4 and can be formed as a bending line BL meets another bending line BL. The overlapping area 220X of the side wall 220 can also be overfolded through bending process. Referring to FIG. 20 (b), the overlapping areas 220X of the side wall 220 can be cut.

Figure 21:
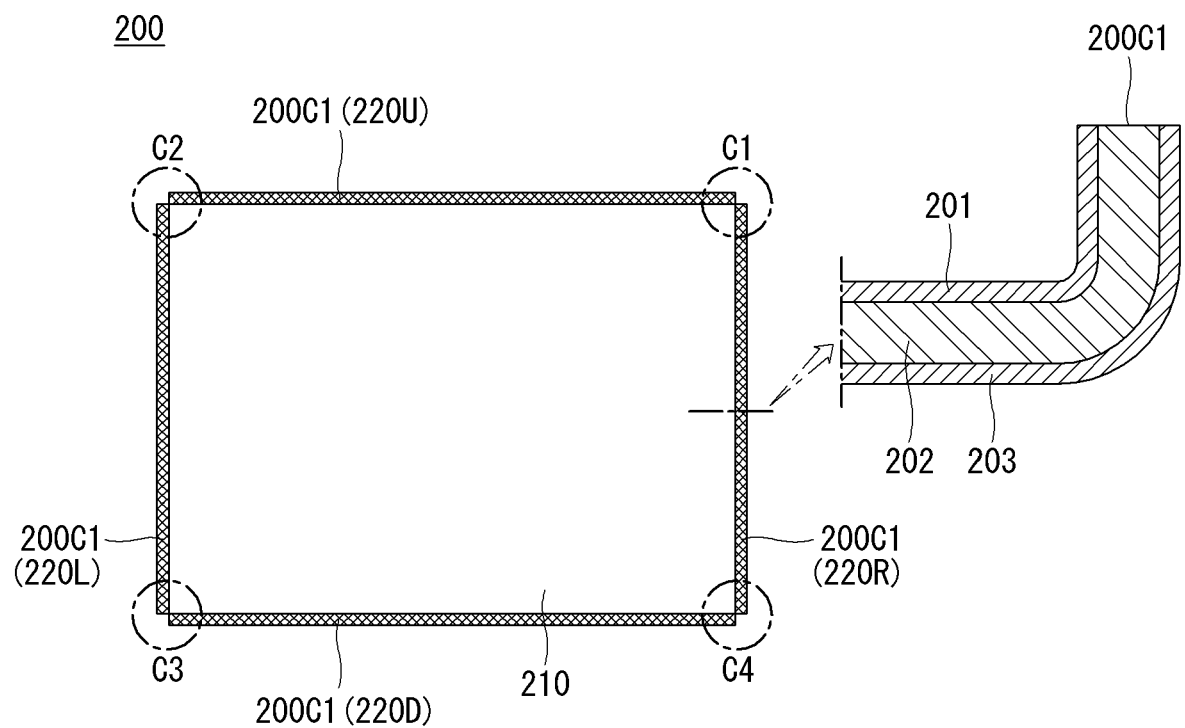

Next, FIG. 21 will be explained in comparison with FIG. 17. Referring to FIG. 21, a front surface of the flat plate portion 210 of the module cover 200 according to an embodiment of the present invention can be observed. As the side wall 220 shown in FIG. 20 is bent toward the front of the flat plate portion 210, the fracture surface 200C1 of the side wall 220 can be observed. The fracture surface 200C1 of the side wall 220 can face the front of the flat plate portion 210.

The module cover 200 can form an internal space. For example, the side wall 220 and the flat plate portion 210 can form the internal space. The internal space formed by the flat plate portion 210, the left side wall 220L, the right side wall 220R, the upper side wall 220U and the lower side wall 220D can be opened forward of the flat plate portion 210. Thus, the display panel 100 (see FIG. 2) can be located in the internal space formed at the module cover 200.

Figure 22:
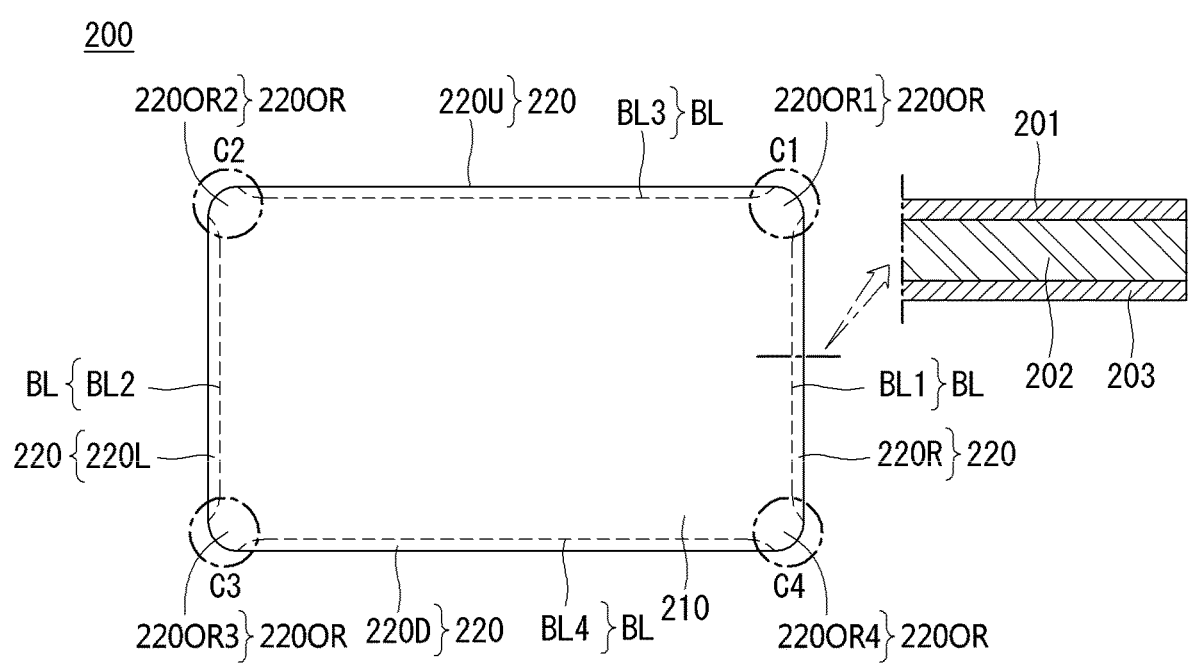

Next, FIG. 22 will be explained in comparison with FIG. 18. Referring to FIG. 22, a front surface of the module cover 200 according to an embodiment of the present invention can be observed. The module cover 200 can be manufactured by processing a metal plate formed by stacking the first to third layers 201, 202, and 203. The module cover 200 shown in FIG. 22 can also be a flat metal plate.

The dotted line BL shown in FIG. 22 can be referred to as a bending line BL. The bending lines BL shown in FIG. 18 can also be formed in a plural. For example, the bending line BL includes a first bending line BL1, a second bending line BL2, a third bending line BL3, and a fourth bending line BL4. The first bending line BL1 can be formed alongside of the right edge of the module cover 200, and the second bending line BL2 can be formed alongside of the left edge of the module cover 200. Further, the third bending line BL3 can be formed alongside of the upper edge of the module cover 200, and the fourth bending line BL4 can be formed alongside of the lower edge of the module cover 200.

Referring to FIG. 22, a plurality of bending lines BL may not intersect with each other. That is, the bending lines BL can reach the edges of the module cover 200 at the corner C1 to C4 or at a position adjacent to the corner C1 to C4. Such a structure of the plurality of bent lines BL can prevent overfolding of the overlapping area 220X of the side wall 220 (see FIG. 20).

In addition, the first bending line BL1 and the third bending line BL3 can be adjacent to each other at the first corner C1. The first open region 220OR1 can be formed at the first corner C1 and be located between the first bending line BL1 and the third bending line BL3.

Further, the second bending line BL2 and the third bending line BL3 can be adjacent to each other at the second corner C2. The second open region 220OR2 can be formed at the second corner C2 and be located between the second bending line BL2 and the third bending line BL3.

The second bending line BL2 and the fourth bending line BL4 can also be adjacent to each other at the third corner C3. Further, the third open region 220OR3 can be formed at the third corner C3 and be located between the second bending line BL2 and the fourth bending line BL4. The third open region 220OR3 also leads to the outer boundary of the flat plate portion 210.

In addition, the first bending line BL1 and the fourth bending line BL4 can be adjacent to each other at the fourth corner C4. The fourth open region 220OR4 can be formed at the fourth corner C4 and be located between the first bending line BL1 and the fourth bending line BL4. The fourth open region 220OR4 also leads to the outer boundary of the flat plate portion 210. The open region 220OR can also represent at least one of the first open region 220OR1, the second region area 220OR2, the third open region 220OR3, and the fourth open region 220OR4.

Figure 23:
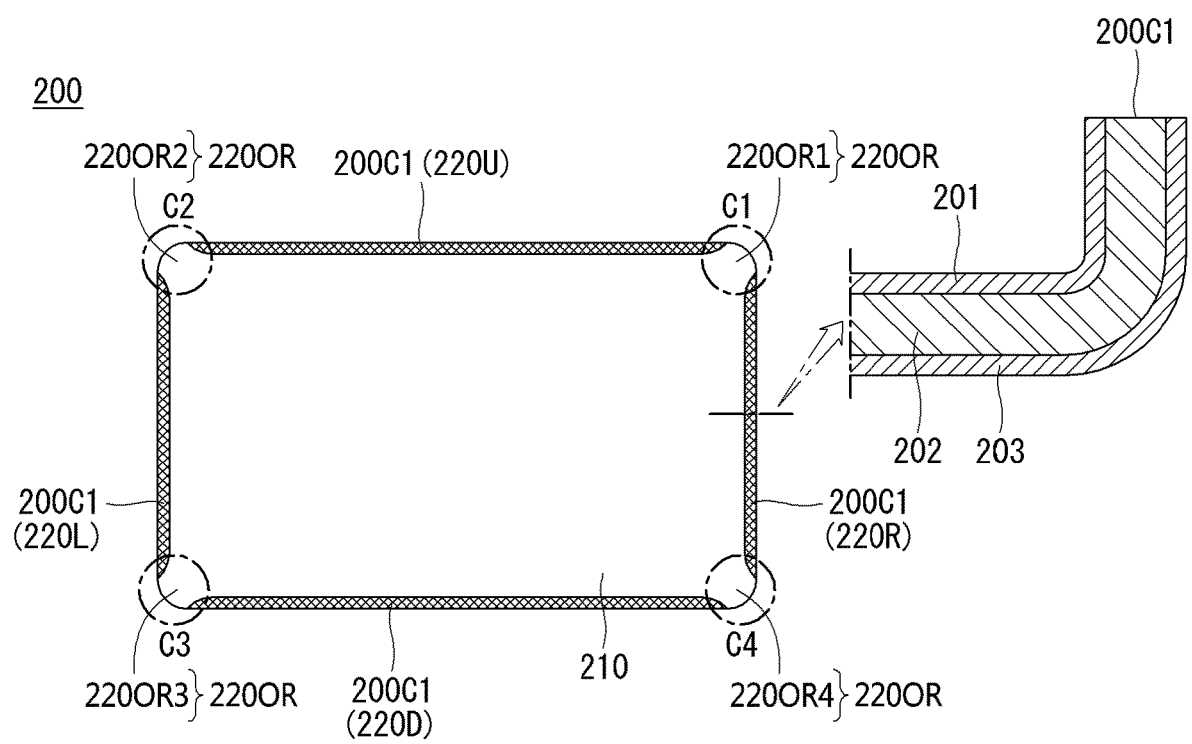

Next, FIG. 23 can be explained in comparison with FIG. 19. Referring to FIG. 23, a front surface of the flat plate portion 210 of the module cover 200 according to an embodiment of the present invention can be observed. As the side wall 220 shown in FIG. 22 is bent toward the front of the flat plate portion 210, the fracture surface 200C1 of the side wall 220 can be observed. The fracture surface 200C1 of the side wall 220 can correspond to a lateral surface of the side wall 220.

The first open region 220OR1 can be formed at the first corner C1 and can be formed between the right side wall 220R and the upper side wall 220U. The first open region 220OR1 and the flat plate portion 210 can also share the same plane.

Further, the second open region 220OR2 can be formed at the second corner C2 and be formed between the left side wall 220L and the upper side wall 220U. The second open region 220OR2 and the flat plate portion 210 can also share the same plane.

In addition, the third open region 220OR3 can be formed at the third corner C3 and can be formed between the left side wall 220L and the lower side wall 220D. The third open region 220OR3 and the flat plate portion 210 can also share the same plane.

Also, the fourth open region 220OR4 can be formed at the fourth corner C4 and can be formed between the right side wall 220R and the lower side wall 220D. The fourth open region 220OR4 and the flat plate portion 210 can also share the same plane.

In addition, the module cover 200 can form an internal space. The internal space formed by the flat plate portion 210, the left side wall 220L, the right side wall 220R, the upper side wall 220U and the lower side wall 220D can be opened forward of the flat plate portion 210. The internal space formed by the module cover 200 can communicate with the outside through the open region 220OR. Thus, the display panel 100 (see FIG. 2) can be located in the internal space formed at the module cover 200.

In addition, the module cover of embodiments of the present invention is particularly advantageous with OLED type displays because of the simplified manufacturing process, the elegant contour design, the slimness of the display and the strength of the module cover. This differs from an LCD display which requires a backlight unit and corresponding guide panel, back cover, module cover etc. which increases the thickness of the display.

According to at least one embodiment of the present invention, a relatively thin display device can be provided. Also, a display device with a slim bezel can be provided. Further, a lightweight display, and a structure for stably protecting a display panel can be provided. In addition, the rigidity of the display device can be improved, the manufacturing process of the display device can be simplified, and the manufacturing cost of the display device can be reduced.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
  a display panel including a front surface displaying an image; and
  a module cover positioned at a rear of the display panel, the module cover including:
  a flat plate portion corresponding to a rear surface of the display panel;
  a side wall extended toward a front of the display panel from the flat plate portion, the side wall covering a side surface of the display panel;
  a bent portion between the flat plate portion and the side wall;
  a fracture surface formed at the side wall and having an angulated boundary; and
  a preventing layer for preventing corrosion of the fracture surface,
  wherein the flat plate portion includes:
    a flat plate portion first layer at the rear of the display panel;
    a flat plate portion second layer at a rear of the flat plate portion first layer; and
    a flat plate portion third layer at a rear of the flat plate portion second layer,
    wherein the flat plate portion second layer includes a material having a greater rigidity than a material of the flat plate portion first layer or the flat plate portion third layer,
  wherein the side wall includes a side wall first layer extending from the flat plate portion first layer and covering side surfaces of the display panel,
  wherein the fracture surface turns into a treated surface through at least one of mechanical treatment, chemical treatment, and optical treatment so that the angulated boundary is rounded,
  wherein the treated surface faces the front of the display panel, and
  wherein the treated surface is convex toward the front of the display panel.

2. The display device of claim 1, wherein the side wall further includes:
  a side wall second layer extended from the flat plate portion second layer and covering the side wall first layer; and
  a side wall third layer extended from the flat plate portion third layer and covering the side wall second layer.

3. The display device of claim 2, wherein the side wall does not include a side wall layer extended from the flat portion first layer.

4. The display device of claim 2, wherein the fracture surface further includes:
  a first cross section of the side wall first layer;
  a second cross section of the side wall second layer; and
  a third cross section of the side wall third layer,
  wherein the first cross section, the second cross section and the third cross section turn into the treated surface through the at least one of mechanical treatment, chemical treatment, and optical treatment, and
  wherein the first cross section, the second cross section and the third cross section and the treated surface face the front of the display panel.

5. The display device of claim 1, wherein the side wall includes:
  an outer side wall bent and extended toward the front of the display panel from the flat plate portion;
  an inner side wall positioned between the outer side wall and the display panel; and
  a connection portion connecting the inner side wall and the outer side wall.

6. The display device of claim 1, wherein the side wall includes:
  a first side wall placed alongside of a first edge of the display panel; and
  a second side wall placed alongside of a second edge of the display panel opposite the first edge of the display panel.

7. The display device of claim 6, wherein the side wall further includes a third side wall placed alongside of a third edge of the display panel connecting the first edge and the second edge.

8. The display device of claim 7, wherein the flat plate portion further includes:
  a first open region positioned between the first side wall and the third side wall, the first open region leading to an outer boundary of the flat plate portion and being opened toward an outside of the flat plate portion in a lateral direction; and a second open region positioned between the second side wall and the third side wall, the second open region leading to the outer boundary of the flat plate portion and being opened toward the outside of the flat plate portion in the lateral direction.

9. The display device of claim 7, wherein the side wall further includes a fourth side wall placed alongside of a fourth edge of the display panel opposite to the third edge of the display panel.

10. The display device of claim 9, wherein the flat plate portion further includes:
   a first open region positioned between the first side wall and the third side wall, the first open region leading to an outer boundary of the flat plate portion and being opened toward an outside of the flat plate portion in a lateral direction;
   a second open region positioned between the second side wall and the third side wall, the second open region leading to the outer boundary of the flat plate portion and being opened toward the outside of the flat plate portion in the lateral direction;
   a third open region positioned between the second side wall and the fourth side wall, the third open region leading to the outer boundary of the flat plate portion and being opened toward the outside of the flat plate portion in the lateral direction; and
   a fourth open region positioned between the first side wall and the fourth side wall, the fourth open region leading to the outer boundary of the flat plate portion and being opened toward the outside of the flat plate portion in the lateral direction.

11. The display device of claim 1, wherein the material of the flat plate portion first layer is the same as the material of the flat plate portion third layer.

12. The display device of claim 11, wherein a heat expansion coefficient of the flat plate portion first layer is greater than a heat expansion coefficient of the flat plate portion second layer.

13. The display device of the claim 12, wherein a heat expansion coefficient of the flat plate portion third layer is greater than the heat expansion coefficient of the flat plate portion second layer.

14. The display device of the claim 13, wherein the heat expansion coefficient of the flat plate portion first layer is the same as the heat expansion coefficient of the third layer.

15. The display device of the claim 1, wherein the display panel is mounted to the flat plate portion first layer via an adhesive material.

16. The display device of the claim 1, wherein a gap exists between the side wall of the module cover and the edge of the display panel.

17. The display device of the claim 1, wherein heat generated by the display panel flows through the gap to an outside of the display device.

18. The display device of the claim 1, wherein a thickness of the flat plate portion second layer is greater than a thickness of the flat plate portion first layer and the flat plate portion third layer.

19. The display device of the claim 1, wherein the display panel comprises an OLED display panel.

\* \* \* \* \*